US012757352B2

(12) United States Patent
Li et al.

(10) Patent No.: US 12,757,352 B2
(45) Date of Patent: Oct. 6, 2026

(54) IMMERSION COOLING SYSTEM

(71) Applicant: Wiwynn Corporation, New Taipei City (TW)

(72) Inventors: Tsung-Han Li, New Taipei City (TW); Chih-An Liao, New Taipei City (TW); Ting-Yu Pai, New Taipei City (TW); Chia-Hsin Hsieh, New Taipei City (TW)

(73) Assignee: WIWYNN CORPORATION, New Taipei City (TW)

( * ) Notice: Subject to any disclaimer, the term of this patent is extended or adjusted under 35 U.S.C. 154(b) by 215 days.

(21) Appl. No.: 18/799,418

(22) Filed: Aug. 9, 2024

(65) Prior Publication Data

US 2025/0063692 A1 Feb. 20, 2025

Related U.S. Application Data

(60) Provisional application No. 63/519,600, filed on Aug. 15, 2023.

(30) Foreign Application Priority Data

Nov. 16, 2023 (TW) ................................ 112144386

(51) Int. Cl.
*H05K 7/20* (2006.01)

(52) U.S. Cl.
CPC ......... *H05K 7/20327* (2013.01); *H05K 7/203* (2013.01); *H05K 7/20781* (2013.01); *H05K 7/20236* (2013.01); *H05K 7/2029* (2013.01)

(58) Field of Classification Search
CPC ............... H05K 7/20327; H05K 7/203; H05K 7/20781; H05K 7/2029; H05K 7/20236
(Continued)

(56) References Cited

U.S. PATENT DOCUMENTS

| | | | | |
|---|---|---|---|---|
| 9,655,279 | B2 * | 5/2017 | Pelletier .................. | G06F 1/206 |
| 11,800,691 | B2 * | 10/2023 | Oseen-Senda ..... | H05K 7/20818 |

(Continued)

FOREIGN PATENT DOCUMENTS

| | | |
|---|---|---|
| CN | 111736672 A | 10/2020 |
| CN | 214257034 U | 9/2021 |

OTHER PUBLICATIONS

Examination report dated Aug. 1, 2024, listed in related Taiwan patent application No. 112144386.

*Primary Examiner* — Joel M Attey
(74) *Attorney, Agent, or Firm* — McClure, Qualey & Rodack, LLP

(57) ABSTRACT

An immersion cooling system includes a work tank, a buffer tank, and a communication control assembly. The work tank has a work-tank gas-phase region and a work-tank liquid-phase region. The buffer tank has a buffer-tank gas-phase region and a buffer-tank liquid-phase region. The communication control assembly includes a first pipeline, a first pump, a second pipeline, and a second valve. In response to that the first pump is actuated, through the first pipeline, a fluid of the work-tank liquid-phase region is transported to the buffer-tank liquid-phase region, or a fluid of the buffer-tank liquid-phase region is transported to the work-tank liquid-phase region. In response to that the second valve is actuated, through the second pipeline, the work-tank gas-phase region is selectively in communication with the buffer-tank gas-phase region.

25 Claims, 10 Drawing Sheets

(58) Field of Classification Search
USPC .......................................................... 165/80.4
See application file for complete search history.

(56) References Cited

U.S. PATENT DOCUMENTS

| | | | | |
|---|---|---|---|---|
| 2020/0315059 | A1* | 10/2020 | Gao ................... | H05K 7/20836 |
| 2020/0383237 | A1* | 12/2020 | Hashimoto ........ | H05K 7/20236 |
| 2022/0361378 | A1 | 11/2022 | Alissa et al. | |
| 2023/0301027 | A1* | 9/2023 | Gao ................... | H05K 7/20836<br>361/700 |
| 2024/0057290 | A1* | 2/2024 | Lin ........................ | H05K 7/203 |

* cited by examiner

IMMERSION COOLING SYSTEM

CROSS-REFERENCE TO RELATED APPLICATION

This non-provisional application claims the benefit of U.S. provisional application Ser. No. 63/519,600, filed on Aug. 15, 2023 and claims the priority of patent application Ser. No. 11/214,4386, filed in Taiwan, R.O.C. on Nov. 16, 2023. The entire of the above-mentioned patent applications is hereby incorporated by references herein and made a part of the specification.

BACKGROUND

Technical Field

The instant disclosure relates to an immersion cooling system, particularly an immersion cooling system having a buffer tank.

Related Art

In the immersion cooling system known to the inventor, component(s) to be cooled is usually immersed in the working fluid. Hence, by conducting a heat exchange with the component(s) to be cooled, the working fluid would be transitioned from a liquid phase to a gas phase, so that both the liquid-phase working fluid and the gas-phase working fluid exist in the immersion cooling system at the same time.

SUMMARY

According to some embodiments, an immersion cooling system is provided, and the immersion cooling system comprises a work tank, a buffer tank, and a communication control assembly. The work tank has a work-tank gas-phase region and a work-tank liquid-phase region. The buffer tank has a buffer-tank gas-phase region and a buffer-tank liquid-phase region. The communication control assembly comprises a first pipeline, a first pump, a second pipeline, and a second valve. In response to that the first pump is actuated, through the first pipeline, a fluid of the work-tank liquid-phase region is transported to the buffer-tank liquid-phase region, or a fluid of the buffer-tank liquid-phase region is transported to the work-tank liquid-phase region. In response to that the second valve is actuated, through the second pipeline, the work-tank gas-phase region is selectively in communication with the buffer-tank gas-phase region.

BRIEF DESCRIPTION OF THE DRAWINGS

The instant disclosure will become more fully understood from the detailed description given herein below for illustration only, and thus not limitative of the instant disclosure, wherein.

DETAILED DESCRIPTION

Figure 1:
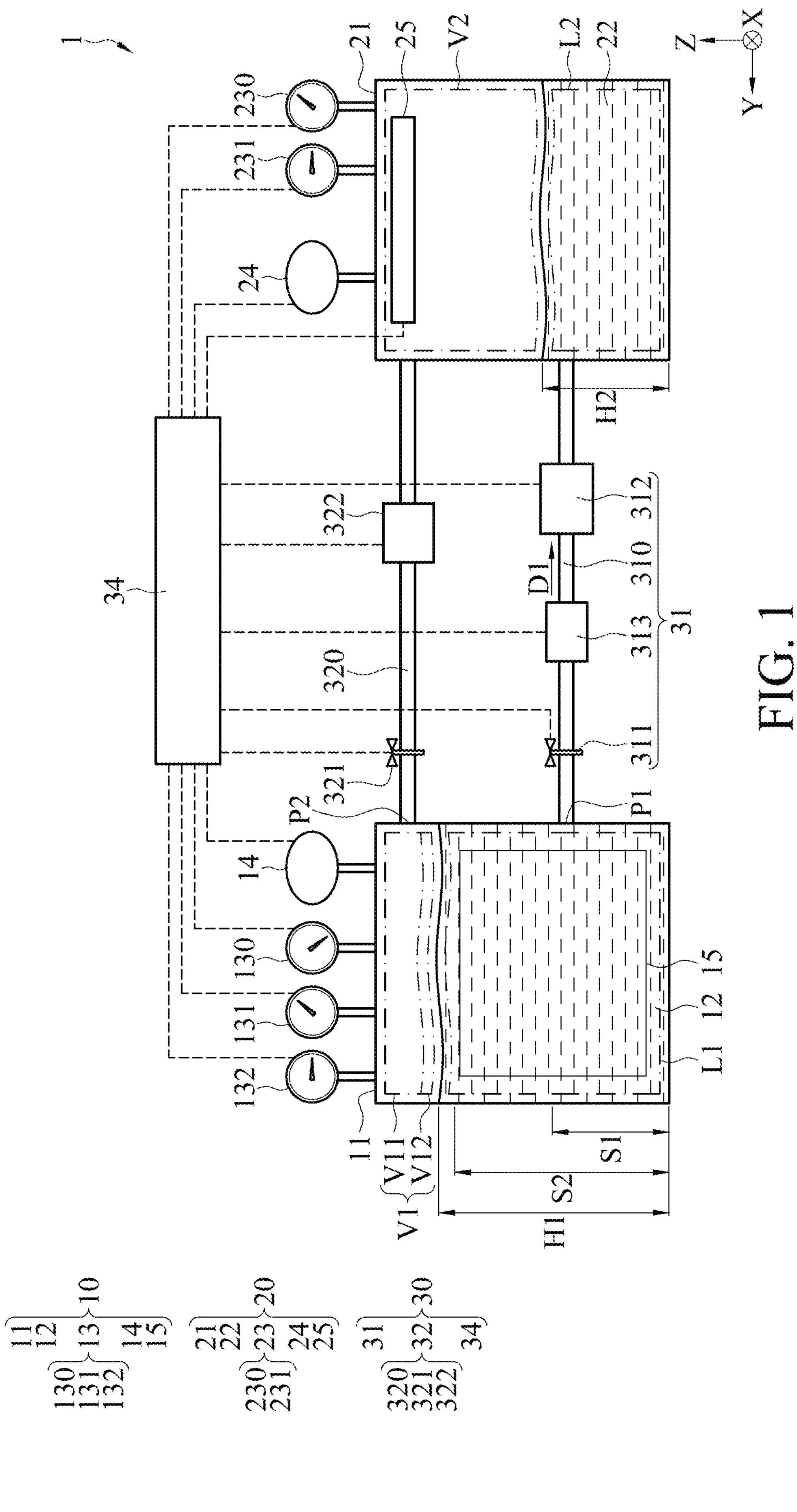
FIG. 1 illustrates a schematic structural view of an immersion cooling system according to some embodiments, wherein the immersion cooling system is under a first operation state.
Figure 3:
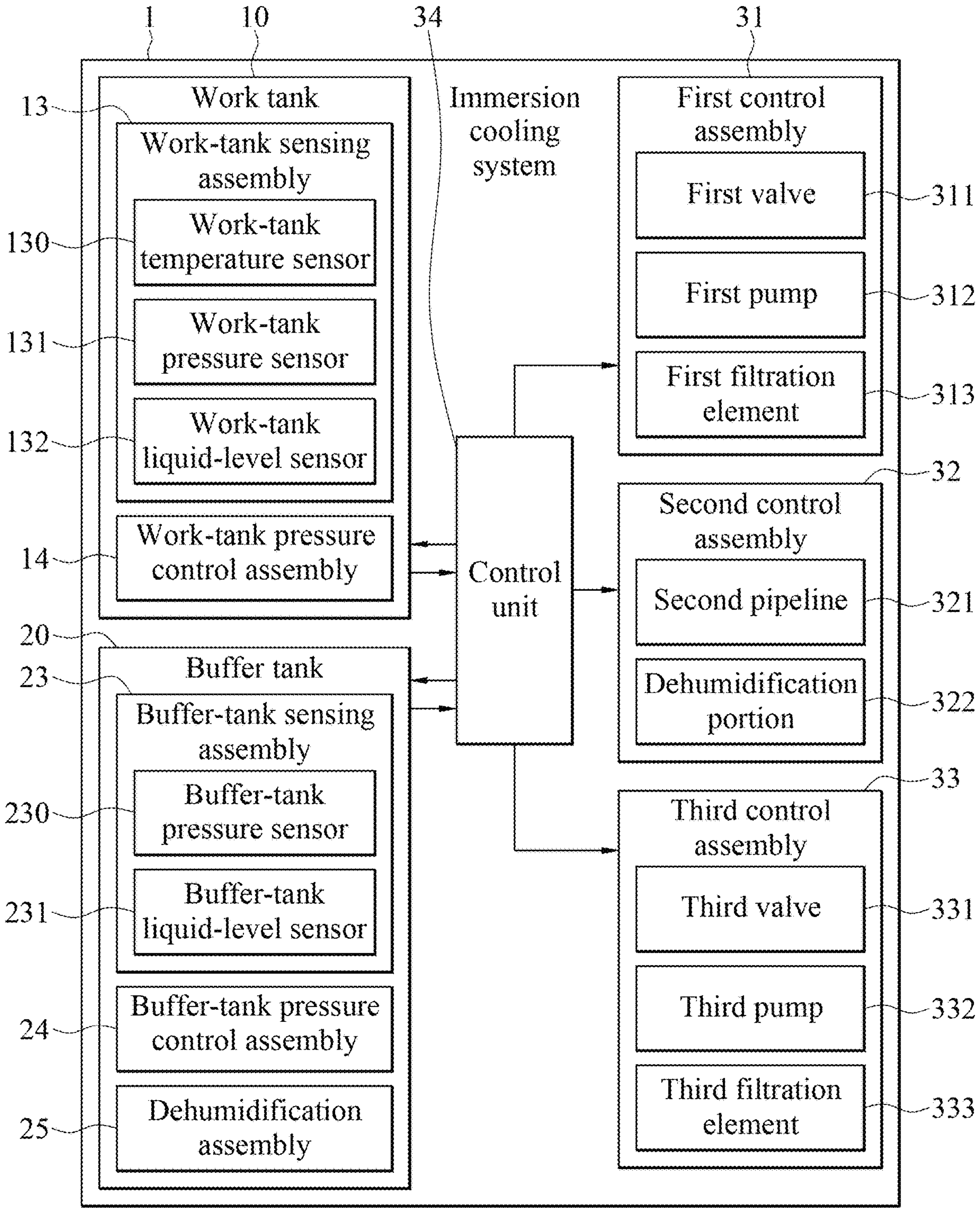
FIG. 3 illustrates a block diagram of a control circuit for the immersion cooling system shown in FIG. 1.

Please refer to FIG. 1 and FIG. 3. FIG. 1 illustrates a schematic structural view of an immersion cooling system 1 according to some embodiments, wherein the immersion cooling system 1 is under a first operation state. FIG. 3 illustrates a block diagram of a control circuit for the immersion cooling system 1 shown in FIG. 1. In FIG. 1, an immersion cooling system 1 comprises a work tank 10, a buffer tank 20, and a communication control assembly 30. The work tank 10 is configured to contain a working fluid (which may be a liquid-phase working fluid and/or a gas-phase working fluid; a fluid 12 refers to a liquid-phase working fluid whenever the contexts herein do not explicitly describe the state of the fluid 12). The work tank has a work-tank gas-phase region V1 and a work-tank liquid-phase region L1. The work-tank gas-phase region V1 is configured to contain a gas-phase mixing fluid including a gas-phase working fluid and gases that may be possibly present (e.g., moisture), and the work-tank liquid-phase region L1 is configured to contain a liquid-phase working fluid. The buffer tank is configured to contain a working fluid (which may be a liquid-phase working fluid, a gas-phase working fluid or both; a fluid 22 refers to a liquid-phase working fluid whenever the contexts herein do not explicitly describe the state of the fluid 22). The buffer tank 20 has a buffer-tank gas-phase region V2 and a buffer-tank liquid-phase region L2. The buffer-tank gas-phase region V2 is configured to contain a gas-phase mixing fluid including a gas-phase working fluid and gases that may be possibly present (e.g., moisture). The buffer-tank liquid-phase region L2 is configured to contain a liquid-phase working fluid. The communication control assembly 30 comprises a first control assembly 31 (comprising a first pipeline 310 and a first pump 312) and a second control assembly 32 (comprising a second pipeline 320 and a second valve 321). In response to that the first pump 312 is actuated, through the first pipeline 310, the fluid 12 of the work-tank liquid-phase region L1 is transported to the buffer-tank liquid-phase region L2, or the fluid 22 of the buffer-tank liquid-phase region L2 is transported to the work-tank liquid-phase region L1 (which will be described in detail later). In response to that the second valve 321 is actuated, through the second pipeline 320, the work-tank gas-phase region V1 is selectively in communication with the buffer-tank gas-phase region V2 (which will be described in detail later) to selectively transport the gas-phase mixing fluid of the work-tank gas-phase region V1 to the buffer-tank gas-phase region V2 or transport the gas-phase mixing fluid of the buffer-tank gas-phase region V2 to the work-tank gas-phase region V1. Hence, by selectively transporting the fluid 12 of the work-tank liquid-phase region L1 to the exterior of the work tank 10 (e.g., the buffer-tank liquid-phase region L2) and selectively transporting the fluid 22 of the buffer-tank liquid-phase region L2 to the interior of the work tank 10 (e.g., the work-tank liquid-phase region L1), the temperature of the fluid 12 of the work tank 10 can be reduced, thereby reducing the overall temperature of the work tank 10. Therefore, according to some embodiments, the overall temperature of the work tank 10 can be reduced rapidly, so that the required time to wait for the work tank 10 to cool down can be reduced (as compared with the required time to wait for the work tank known to the inventors to cool down), thereby reducing the cooling costs thereof.

Please still refer to FIG. 1. According to some embodiments, the work tank 10 comprises a work-tank sensing assembly 13, and the communication control assembly 30 further comprises a control unit 34 (as shown in FIG. 1 and FIG. 3). The work-tank sensing assembly 13 is configured to sense a temperature of the work-tank liquid-phase region L1 and a pressure of the work-tank gas-phase region V1. The control unit 34 is configured to, in response to that the temperature of the work-tank liquid-phase region L1 is greater than a preset temperature under a maintenance mode (which will be described in detail later), actuate the first pump 312 to transport the fluid 12 of the work-tank liquid-phase region L1 to the buffer-tank liquid-phase region L2 (which will be described in detail later), and the control unit 34 is configured to, in response to that the pressure of the work-tank gas-phase region V1 is not within a preset pressure range, actuate the second valve 321 to have the work-tank gas-phase region V1 to be in communication with the buffer-tank gas-phase region V2 (which will be described in detail later). Hence, by monitoring the temperature of the fluid 12 of the work tank 10, when the temperature of the fluid 12 is abnormal (e.g., the temperature is excessively high), the fluid 12 of the work tank 10 can be selectively transported to the buffer tank 20.

Moreover, with the aid of monitoring the pressure of the work tank 10, when the pressure is abnormal (e.g., failing to fall within the preset pressure range), the work-tank gas-phase region V1 of the work tank 10 can be selectively in communication with the buffer-tank gas-phase region V2 of the buffer tank 20, so that the pressure between the two tanks (i.e., the work tank 10 and the buffer tank 20) can be in equilibrium rapidly.

Please still refer to FIG. 1. According to some embodiments, the work tank 10 comprises a work-tank body 11 configured to contain the fluid 12 (e.g., the liquid-phase working fluid), the gas-phase mixing fluid (including the gas-phase working fluid and gases that may be possibly present (e.g., moisture)), and the component(s) to be cooled 15. The working fluid (or referred to as the heat-transfer fluid) is a non-conductive fluid. Under normal circumstances (e.g., at a temperature less than the boiling point of the working fluid), the working fluid is a liquid-phase working fluid (i.e., the fluid 12). Since the boiling point of the working fluid is less than or substantially equal to the temperature of the component(s) to be cooled 15, when the component(s) to be cooled 15 is immersed in the liquid-phase working fluid, the liquid-phase working fluid would absorb the heat from the component(s) to be cooled and thus the temperature of the liquid-phase working fluid may reach a critical boiling point thereof rapidly, so that the liquid-phase working fluid is further evaporated as the gas-phase working fluid. The component(s) to be cooled 15 may be any component with a temperature greater than the temperature of the working fluid. For example, the number of the component(s) to be cooled 15 is one or more than one. For another example, the component(s) to be cooled is a single rack-mounted server system or a cabinet-mounted server system including a plurality of rack-mounted server units.

Please still refer to FIG. 1. According to some embodiments, the work-tank gas-phase region V1 comprises an air sub-region V11 and a vapor sub-region V12. The air sub-region V11 is configured to contain air, such as moisture, other common atmospheric gases or both. The vapor sub-region V12 is configured to contain the gas-phase working fluid. A small amount of the gas-phase working fluid may exist in the air sub-region V11, and the air may exist in the vapor sub-region V12. A boundary between the air sub-region V11 and the vapor sub-region V12 may not be a fixed boundary; instead, the boundary between the air sub-region V11 and the vapor sub-region V12 may change with the pressure, temperature, and/or the relative proportion of the air over the gas-phase working fluid in the work tank 10; for example, the boundary would change along the Z direction shown in FIG. 1. In some embodiments, the specific gravity of the gas-phase working fluid is greater than the specific gravity of the air, so that the air sub-region V11 is above the vapor sub-region V12 (as shown in FIG. 1). For example, in FIG. 1, the interior of the work tank 10 may be sequentially divided, from top to bottom (i.e., from the +Z direction to the −Z direction), into the air sub-region V11, the vapor sub-region V12, and the work-tank liquid-phase region L1.

Please refer to FIG. 1. According to some embodiments, the buffer tank 20 comprises a buffer-tank body 21 configured to contain the fluid 22 (e.g., the liquid-phase working fluid) and the gas-phase mixing fluid (including the gas-phase working fluid and gases that may be possibly present (e.g., moisture)). The working fluid of the buffer-tank body 21 may have physical and chemical properties compatible with those of the working fluid of the work-tank body 11; embodiments of the working fluid can be referred to the aforementioned embodiments, which are not further described in detail herein. Hence, according to some embodiments, in response to that the buffer tank 20 is selectively in communication with the work tank 10, the working fluid of the buffer tank 20 and the working fluid of the work tank 10 may be compatible with each other and can flow freely between the buffer tank 20 and the work tank 10.

Please still refer to FIG. 1 and FIG. 3. According to some embodiments, the buffer tank 20 further comprises a dehumidification assembly 25 corresponding to the buffer-tank gas-phase region V2. For example, the dehumidification assembly 25 is at the upper portion of the buffer-tank body 21 to be correspondingly arranged in the buffer-tank gas-phase region V2. The dehumidification assembly 25 may be any device with the function of removing moisture. Hence, according to some embodiments, through the dehumidification assembly 25, the moisture in the gas-phase mixing fluid of the buffer-tank gas-phase region V2 may be removed, thereby preventing the buffer tank 20 (and even the work tank 10) from being damaged. Therefore, according to some embodiments, the overall cooling performance of the immersion cooling system 1 can also be prevented from being affected. In FIG. 1 and FIG. 3, according to some embodiments, the dehumidification assembly 25 may selectively be communicationally connected to the control unit 34 to transmit signals back to the control unit 34.

Figure 7:
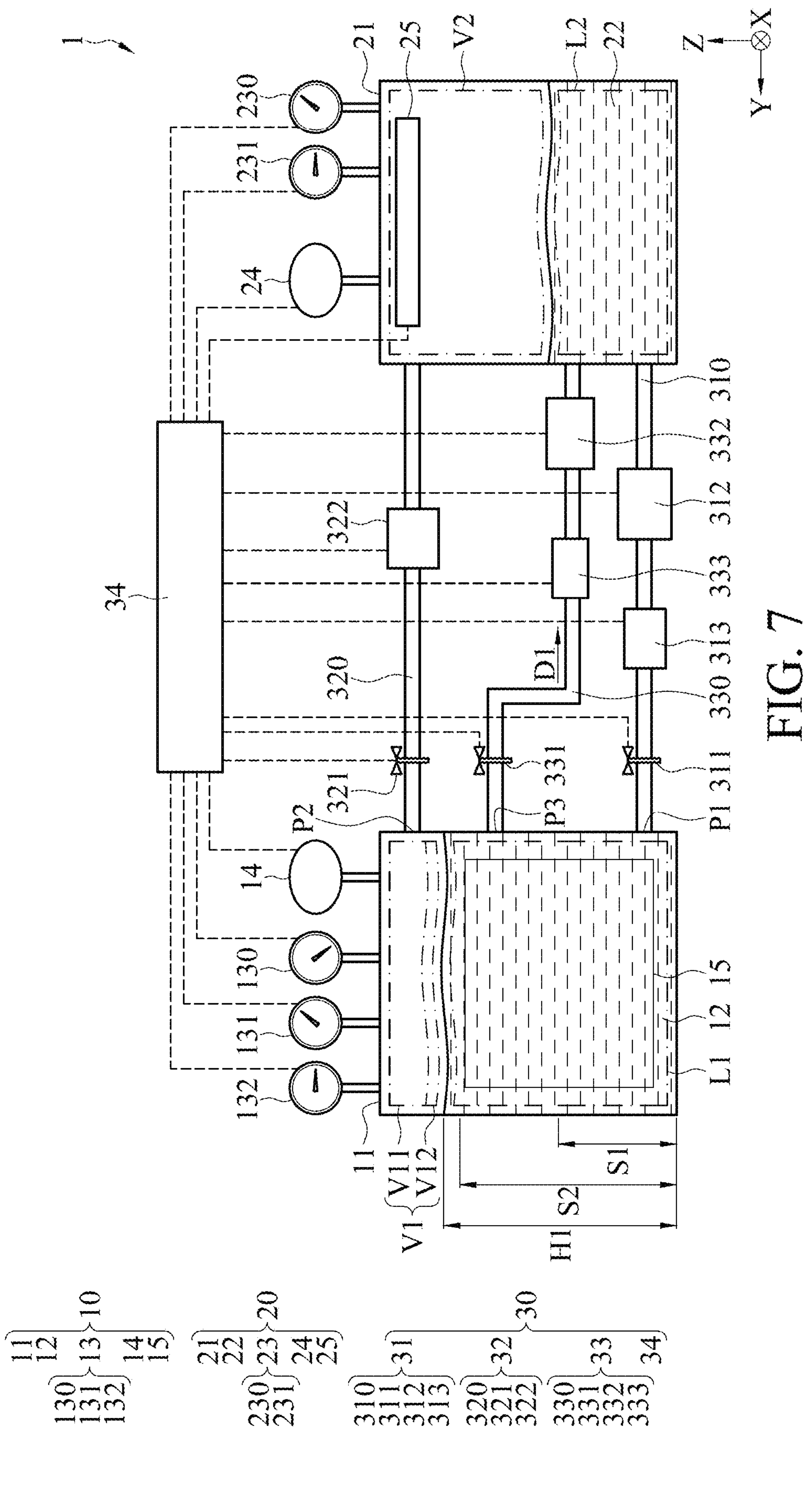
FIG. 7 illustrates a schematic structural view of an immersion cooling system according to some embodiments, wherein the immersion cooling system is under a first operation state.
Figure 8:
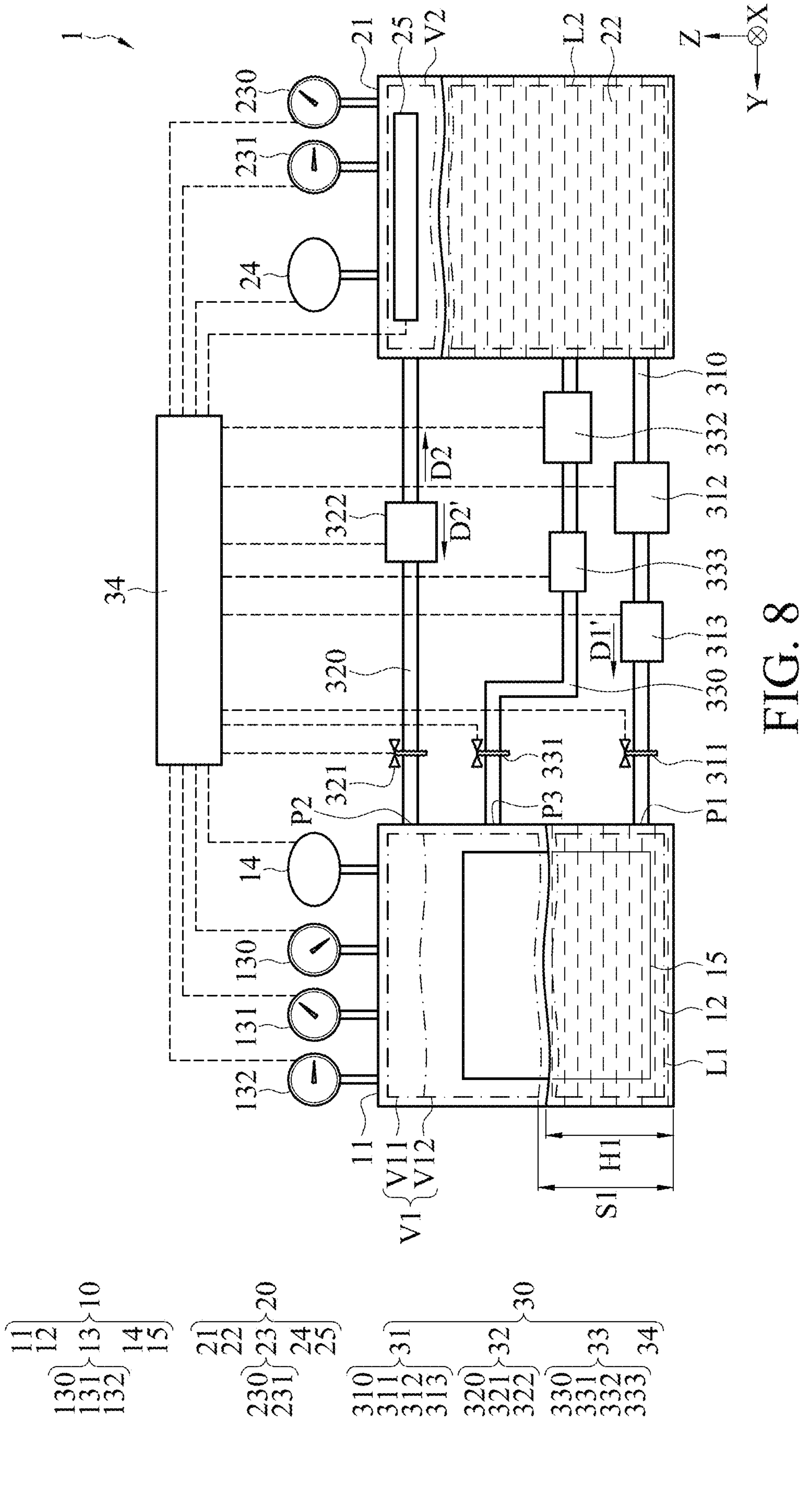
FIG. 8 illustrates a schematic structural view of the immersion cooling system shown in FIG. 7, wherein the immersion cooling system is under a second operation state.

Please still refer to FIG. 1. According to some embodiments, the work-tank body 11 has a plurality connection ports, such as a first connection port P1, a second connection port P2, and a third connection port P3 (as shown in FIG. 7 and FIG. 8 and will be described in detail later). These connection ports may be used for having the work tank 10 (e.g., the work-tank body 11) to be in communication with the buffer tank 20 (e.g., the buffer-tank body 21). In some embodiments, depending upon the arrangement of the work-tank gas-phase region V1 and the work-tank liquid-phase region L1, a specific arrangement relationship may exist among these connection ports (e.g., the height arrangement relationship along the Z direction as shown in FIG. 1). For example, in FIG. 1, the first connection port P1 is at the bottom of the work-tank body 11 and adjacent to the work-tank liquid-phase region L1, so that the fluid 12 of the work-tank liquid-phase region L1 can be transported to the exterior of the work-tank body 11, or other fluid (e.g., the fluid 22 of the buffer-tank liquid-phase region L2) can be transported to the work-tank liquid-phase region L1. For another example, the second connection port P2 is at the upper portion of the work-tank body 11 and adjacent to the work-tank gas-phase region V1, so that the gas-phase mixing fluid of the work-tank gas-phase region V1 can be transported to the exterior of the work-tank body 11, or other fluid (e.g., the gas-phase mixing fluid of the buffer-tank gas-phase region V2) can be transported to the work-tank gas-phase region V1. In some embodiments, along the Z direction shown in FIG. 1, the location level of the second connection port P2 is higher than the location level of the first connection port P1. In some embodiments, depending upon the type of the gas to be transported, the second connection port P2 may be arranged to be adjacent to the air sub-region V11 (as shown in FIG. 1) or the vapor sub-region V12. For example, in FIG. 1, the second connection port P2 is at the top of the work-tank body 11 and adjacent to the air sub-region V11, so that the gas in the air sub-region V11 can be transported to the exterior of the work-tank body 11.

Please still refer to FIG. 1. According to some embodiments, one of two ends of the first pipeline 310 is in communication with the work-tank liquid-phase region L1 through the first connection port P1, while the other of two ends of the first pipeline 310 is directly in communication with the buffer-tank liquid-phase region L2. Hence, the fluid 12 of the work-tank liquid-phase region L1 and the fluid 22 of the buffer-tank liquid-phase region L2 can be transported between the work-tank liquid-phase region L1 and the buffer-tank liquid-phase region L2 directly through the first connection port P1. In some other embodiments, one of two ends of the first pipeline 310 is indirectly in communication with the work-tank liquid-phase region L1; for example, one of two ends of the first pipeline 310 may selectively extend from the work-tank gas-phase region V1 to the interior of the work tank 10 to be in communication with the work-tank liquid-phase region L1. In some other embodiments, the other of two ends of the first pipeline 310 is indirectly in communication with the buffer-tank liquid-phase region L2; for example, the other of two ends of the first pipeline 310 may selectively extend from the buffer-tank gas-phase region V2 to the interior of the buffer tank 20 to be further in communication with the buffer-tank liquid-phase region L2. The manners that the two ends of the first pipeline 310 are respectively in communication with the work-tank liquid-phase region L1 and the buffer-tank liquid-phase region L2 may be independently a direct communication or an indirect communication.

Please still refer to FIG. 1 and FIG. 3. According to some embodiments, the first pump 312 is at the first pipeline 310 and between the work tank 10 and the buffer tank 20. The first pump 312 may be any device that can increase the pressure of the fluid, so that the fluid 12 and the fluid 22 can have a greater propulsion force, respectively. The first pump 312 is communicationally connected to the control unit 34 to receive the control signals from the control unit 34. Hence, through the first pump 312 actuated by the control unit 34, the fluid 12 and/or the fluid 22 can flow inside the first pipeline 310 along either direction of the first pipeline 310 (e.g., the first direction D1 shown in FIG. 1 or the first direction D1' shown in FIG. 2). In other words, in some embodiments, even though the communication control assembly 30 comprises only a single pipeline (i.e., the first pipeline 310 shown in FIG. 1), the fluid 12 of the work-tank liquid-phase region L1 can be transported to the buffer-tank liquid-phase region L2 through the first pipeline 310, and the fluid 22 of the buffer-tank liquid-phase region L2 can also be transported to the work-tank liquid-phase region L1 through the same first pipeline 310. Therefore, according to some embodiments, arranging such a number of pipelines more than required is unnecessary, which helps reduce the arrangement space of the entire system.

Please still refer to FIG. 1 and FIG. 3. According to some embodiments, the first control assembly 31 further comprises a first valve 311 at the first pipeline 310 and between the work tank 10 and the buffer tank 20. The first valve 311 may be between the work tank 10 and the first pump 312 (as shown in FIG. 1) or between the first pump 312 and the buffer tank 20. The first valve 311 may be any device with a valve function such as a non-return valve (or referred to as a check valve). The first valve 311 is communicationally connected to the control unit 34 to receive the control signals from the control unit 34. Hence, through the first valve 311 actuated by the control unit 34, the work-tank liquid-phase region L1 and the buffer-tank liquid-phase region L2 can be controlled to be either in communication with each other or not (for example, the first valve 311 is configured to be actuated by the control unit 34 to be selectively shut off to prevent the fluid 12 and/or the fluid 22 from flowing between the work-tank liquid-phase region L1 and the buffer-tank liquid-phase region L2), so that the transportation of the fluid 12 and/or the fluid 22 between the work-tank liquid-phase region L1 and the buffer-tank liquid-phase region L2 through the first pipeline 310 could be controlled.

Please still refer to FIG. 1 and FIG. 3. According to some embodiments, the control assembly 31 further comprises a first filtration element 313 at the first pipeline 310 and between the work tank 10 and the buffer tank 20. The first filtration element 313 may be between the work tank 10 and the first pump 312 (as shown in FIG. 1) or between the first pump 312 and the buffer tank 20. The first filtration element 313 may be any device with functions of filtrating impurities, removing moisture or both. Hence, through the first filtration element 313, impurities and moisture in the fluid 12 and/or the fluid 22 can be further removed, and thus the work tank 10, the buffer tank 20 or both can be prevented from being damaged, so that the overall cooling performance of the immersion cooling system 1 can also be prevented from being affected. In FIG. 1 and FIG. 3, according to some embodiments, the first filtration element 313 may selectively be communicationally connected to the control unit 34 to transmit signals back to the control unit 34.

Figure 2:
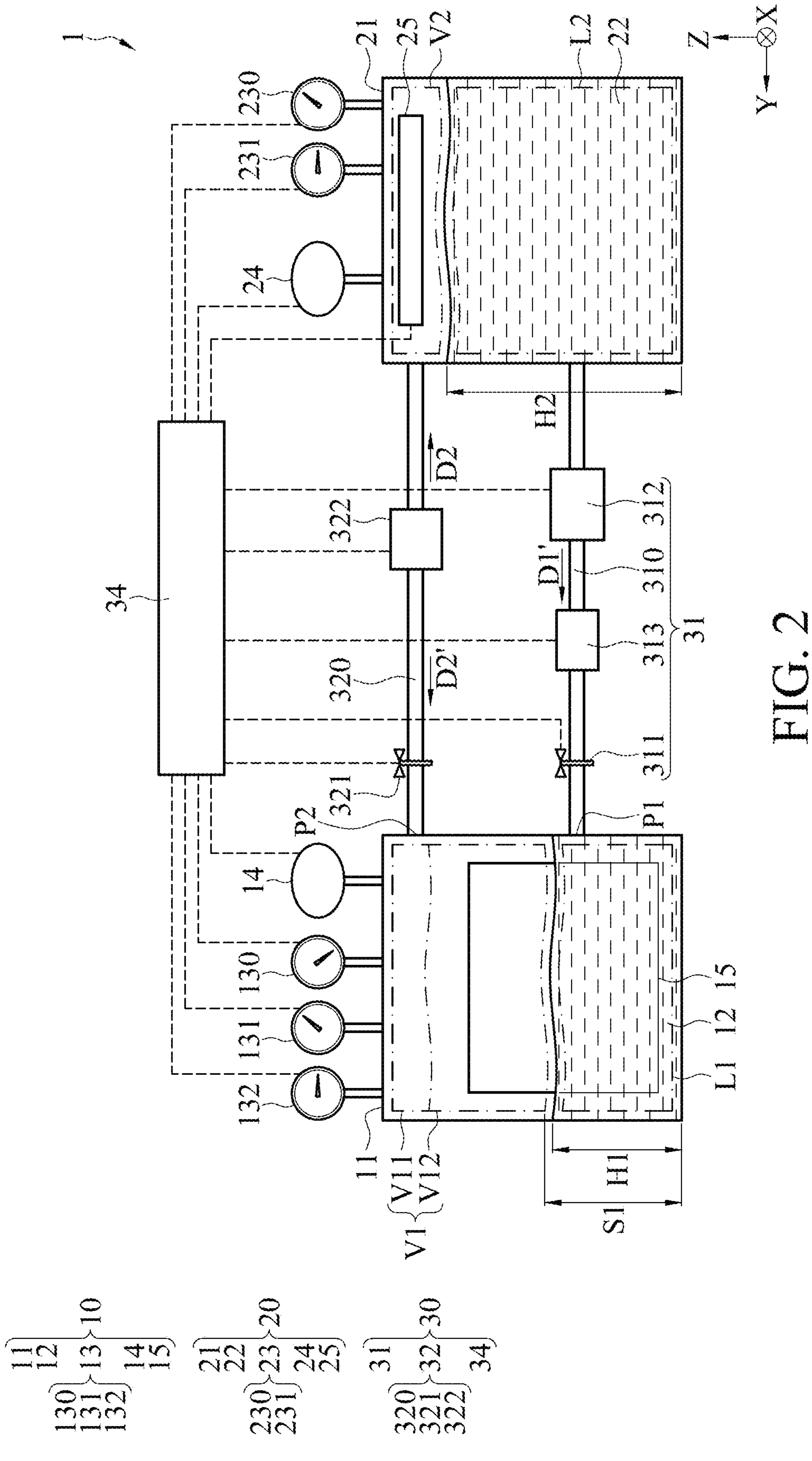
FIG. 2 illustrates a schematic structural view of the immersion cooling system shown in FIG. 1, wherein the immersion cooling system is under a second operation state.

Please refer to FIG. 1. According to some embodiments, one of two ends of the second pipeline 320 is in communication with the work-tank gas-phase region V1 through the second connection port P2, while the other of two ends of the second pipeline 320 is directly in communication with the buffer-tank gas-phase region V2. Hence, the air of the air sub-region V11 and the gas-phase fluid of the buffer-tank gas-phase region V2 can be transported between the air sub-region V11 and the buffer-tank gas-phase region V2 directly through the second connection port P2. Therefore, when a pressure difference exists between the work-tank gas-phase region V1 (or the air sub-region V11) and the buffer-tank gas-phase region V2, the gas-phase mixing fluid of the work tank 10, the buffer tank 20 or both would be driven by the pressure difference to be transported in the second pipeline 320 along at least one direction of the second pipeline 320 (e.g., the second directions D2, D2' as shown in FIG. 2). Hence, a pressure equilibrium can be achieved between the work-tank gas-phase region V1 (or the air sub-region V11) and the buffer-tank gas-phase region V2.

Please still refer to FIG. 1 and FIG. 3. According to some embodiments, the second valve 321 is at the second pipeline 320 and between the work tank 10 and the buffer tank 20. The second valve 321 may be any device with a valve function such as a non-return valve. The second valve 321 is communicationally connected to the control unit 34 to receive the control signals from the control unit 34. Hence, according to some embodiments, the second valve 321 could be actuated by the control unit 34, so that the work-tank gas-phase region V1 and the buffer-tank gas-phase region V2 can be controlled either in communication with each other or not (for example, the second valve 321 is configured to be actuated by the control unit 34 to be selectively shut off to prevent the gas-phase mixing fluid from flowing between the work-tank gas-phase region V1 and the buffer-tank gas-phase region V2), therefore controlling the transportation of the gas-phase mixing fluid between the work-tank gas-phase region V1 and the buffer-tank gas-phase region V2 through the second pipeline 320.

In some embodiments, the second control assembly 32 further comprises a second pump (not shown), and the second pump is at the second pipeline 320 and between the work tank 10 and the buffer tank 20. The second pump may be any device that can increase the pressure of the fluid, so that the gas-phase mixing fluid can have a greater propulsion force. The second pump may be communicationally connected to the control unit 34 to receive the control signals from the control unit 34. Hence, according to some embodiments, through the second pump actuated by the control unit 34, the gas-phase mixing fluid can be transported in the second pipeline 320 along either direction of the second pipeline 320 (e.g., the second directions D2, D2' as shown in FIG. 2).

Please still refer to FIG. 1 and FIG. 3. According to some embodiments, the second control assembly 32 further comprises a dehumidification portion 322 at the second pipeline 320 and between the work tank 10 and the buffer tank 20. The dehumidification portion 322 is between the work tank 10 and the second valve 321 or between the second valve 321 or the buffer tank 20 (as shown in FIG. 1). The dehumidification portion 322 may be any device with the function of removing moisture. Hence, according to some embodiments, through the dehumidification portion 322, the moisture in the gas-phase mixing fluid of the buffer-tank gas-phase region V2 can be further removed, and thus the buffer tank 20 (or the work tank 10) can be prevented from being damaged, so that the overall cooling performance of the immersion cooling system 1 can also be prevented from being affected. In FIG. 1 and FIG. 3, according to some embodiments, the dehumidification portion 322 may selectively be communicationally connected to the control unit 34 to transmit the signals back to the control unit 34.

Moreover, please still refer to FIG. 1. According to some embodiments, the temperature of the second control assembly 32 (which may comprise the second pipeline 320, the second valve 321, and the dehumidification portion 322) is greater than or equal to the boiling point or the dew point of the gas-phase mixing fluid (e.g., greater than or equal to the boiling point or the dew point of water and greater than the boiling point or the dew point of the working fluid), so that the moisture in the gas-phase mixing fluid can be prevented from being condensed into water during the transportation of the gas-phase mixing fluid in the second pipeline 320. Therefore, according to some embodiments, by adjusting the temperature of the second control assembly 32, the gas-phase mixing fluid can be protected from reacting with the condensed water in the second pipeline 320, and thus the properties of the fluid 12 and/or the fluid 22 can be protected from being eventually changed.

Please refer to FIG. 1 to FIG. 3 at the same time. FIG. 2 illustrates a schematic structural view of the immersion cooling system 1 shown in FIG. 1, wherein the immersion cooling system 1 is under a second operation state. In some embodiments, the work-tank sensing assembly 13 comprises a work-tank temperature sensor 130 configured to sense the temperature of the work-tank liquid-phase region L1 (e.g., the temperature of the fluid 12) and transmit the temperature of the work-tank liquid-phase region L1 back to the control unit 34. The work-tank temperature sensor 130 may be any device with the function of temperature sensing (e.g., a thermometer) and in communication with the work-tank body 11 to sense the temperature of the work-tank liquid-phase region L1. The control unit 34 obtains the temperature of the work-tank liquid-phase region L1 through the work-tank temperature sensor 130, and the obtained temperature may be further set as a criterion for determining whether it is necessary to transport the fluid 12 of the work-tank liquid-phase region L1 to the buffer-tank liquid-phase region L2 (and/or whether it is necessary to transport the fluid 22 of the buffer-tank liquid-phase region L2 to the work-tank liquid-phase region L1). Therefore, the cooling performance of the fluid 12 can be prevented from being affected by the abnormal temperature of the work tank 10.

Figure 4:
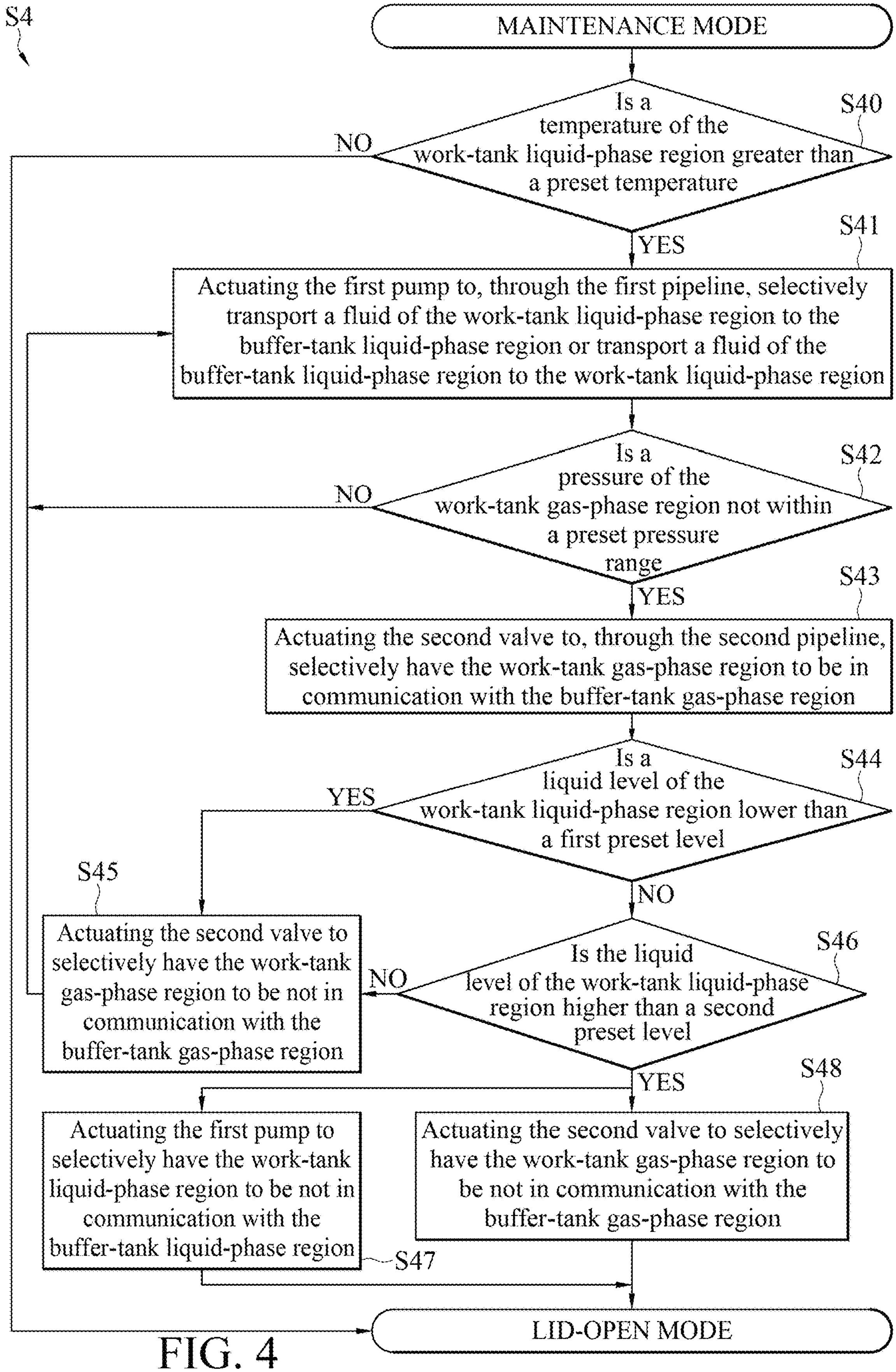
FIG. 4 illustrates a workflow chart of the immersion cooling system under the maintenance mode according to some embodiments.

For example, the control unit 34 may set a preset temperature (which may refer to as either a preset temperature value or a preset temperature range) based on the physical properties of the working fluid (such as the boiling point or the dew point of the working fluid), where the preset temperature value may, for example, comprise at least one of an upper temperature limit and a lower temperature limit. Hence, in response to that the control unit 34 determines that the temperature of the work-tank liquid-phase region L1 is greater than or equal to the upper temperature limit through the work-tank temperature sensor 130, the control unit 34 then determines that the immersion cooling system 1 should launch a "maintenance mode" (as shown in FIG. 4 and will be described in detail later). In some other embodiments, in response to that the control unit 34 determines that the temperature of the work-tank liquid-phase region L1 is less than the lower temperature limit, the control unit 34 then determines that the immersion cooling system 1 should stop the "maintenance mode" or further launch another mode such as a "lid-open mode" (as shown in FIG. 4 and will be described in detail later). Under the lid-open mode, the lid opening of the work tank 10 of the immersion cooling system 1 may be conducted automatically or manually, so that the component(s) inside the work tank 10 (e.g., the component(s) to be cooled 15 as shown in FIG. 1) can be checked or replaced.

Please still refer to FIG. 1 to FIG. 3. According to some embodiments, the work-tank sensing assembly 13 comprises a work-tank pressure sensor 131 configured to sense the pressure of the work-tank gas-phase region V1 and transmit the pressure of the work-tank gas-phase region V1 back to the control unit 34. The work-tank pressure sensor 131 may be any device with the function of pressure sensing (e.g., a pressure gauge) and in communication with the work-tank body 11 to sense the pressure of the work-tank gas-phase region V1. The control unit 34 obtains the pressure of the work-tank gas-phase region V1 through the work-tank pressure sensor 131. Since the pressure of the work tank 10 transmitted from the work-tank pressure sensor 131 is directly related to the dew point of the liquid-phase working fluid condensed from the gas-phase working fluid, and the pressure of the work tank 10 may be further set as a criterion for determining whether it is necessary to have the work tank 10 (e.g., the work-tank gas-phase region V1) to be in communication with the buffer tank 20 (e.g., the buffer-tank gas-phase region V2). Therefore, according to some embodiments, the cooling performance of the fluid 12 can be prevented from being affected by the abnormal pressure of the work tank 10, and the temperature of the fluid 12 of the work-tank liquid-phase region L1 can even be reduced more efficiently and rapidly.

For example, the control unit 34 may set a preset pressure range based on the physical properties of the working fluid (such as the boiling point or the dew point of the working fluid), where the preset pressure range may, for example, comprise an upper pressure limit and a lower pressure limit to obtain a preset range. Hence, according to some embodiments, in response to that the pressure of the work-tank gas-phase region V1 transmitted from the work-tank pressure sensor 131 falls within the preset pressure range, the control unit 34 then determines that the pressure of the work-tank gas-phase region V1 is normal and thus it is not necessary to have the work tank 10 (e.g., the work-tank gas-phase region V1) to be in communication with the buffer tank 20 (e.g., the buffer-tank gas-phase region V2).

In some embodiments, in response to that the pressure of the work-tank gas-phase region V1 transmitted from the work-tank pressure sensor 131 is not within the preset pressure range (e.g., the pressure of the work-tank gas-phase region V1 is determined to be greater than the upper pressure limit or less than the lower pressure limit), the control unit 34 then determines that the pressure of the work-tank gas-phase region V1 is abnormal (e.g., excessively high or excessively low) and it is thus necessary to have the work tank 10 (e.g., the work-tank gas-phase region V1) to be in communication with the buffer tank 20 (e.g., the buffer-tank gas-phase region V2). Therefore, according to some embodiments, the gas-phase mixing fluid of the buffer-tank gas-phase region V2 (with a higher pressure) can be transported to the work-tank gas-phase region V1 (with a lower pressure), or the gas-phase mixing fluid of the work-tank gas-phase region V1 (with a higher pressure) can be transported to the buffer-tank gas-phase region V2 (with a lower pressure), so that the pressure of the two tanks (i.e., the work tank 10 and the buffer tank 20) can be in equilibrium.

Please still refer to FIG. 1 to FIG. 3. According to some embodiments, the work-tank sensing assembly 13 comprises a work-tank liquid-level sensor 132 configured to sense the liquid level H1 of the fluid 12 of the work-tank liquid-phase region L1 and transmit the liquid level H1 of the fluid 12 back to the control unit 34. The work-tank pressure sensor 131 may be any device with the function of liquid-level sensing (e.g., a liquid level sensor) and in communication with the work-tank body 11 to sense the liquid level H1 of the fluid 12 in the work-tank liquid-phase region L1. The control unit 34 obtains the liquid level H1 of the fluid 12 through the work-tank liquid-level sensor 132, and the obtained liquid level H1 may be further set as a criterion for determining whether it is necessary to launch or stop the transportation of the fluid 12 of the work-tank liquid-phase region L1 and/or the fluid 22 of the buffer-tank liquid-phase region L2. Therefore, according to some embodiments, the cooling performance of the fluid 12 can be prevented from being affected by the abnormal liquid level of the work tank 10, and the temperature of the fluid 12 of the work-tank liquid-phase region L1 can even be reduced more efficiently and rapidly.

Figure 5:
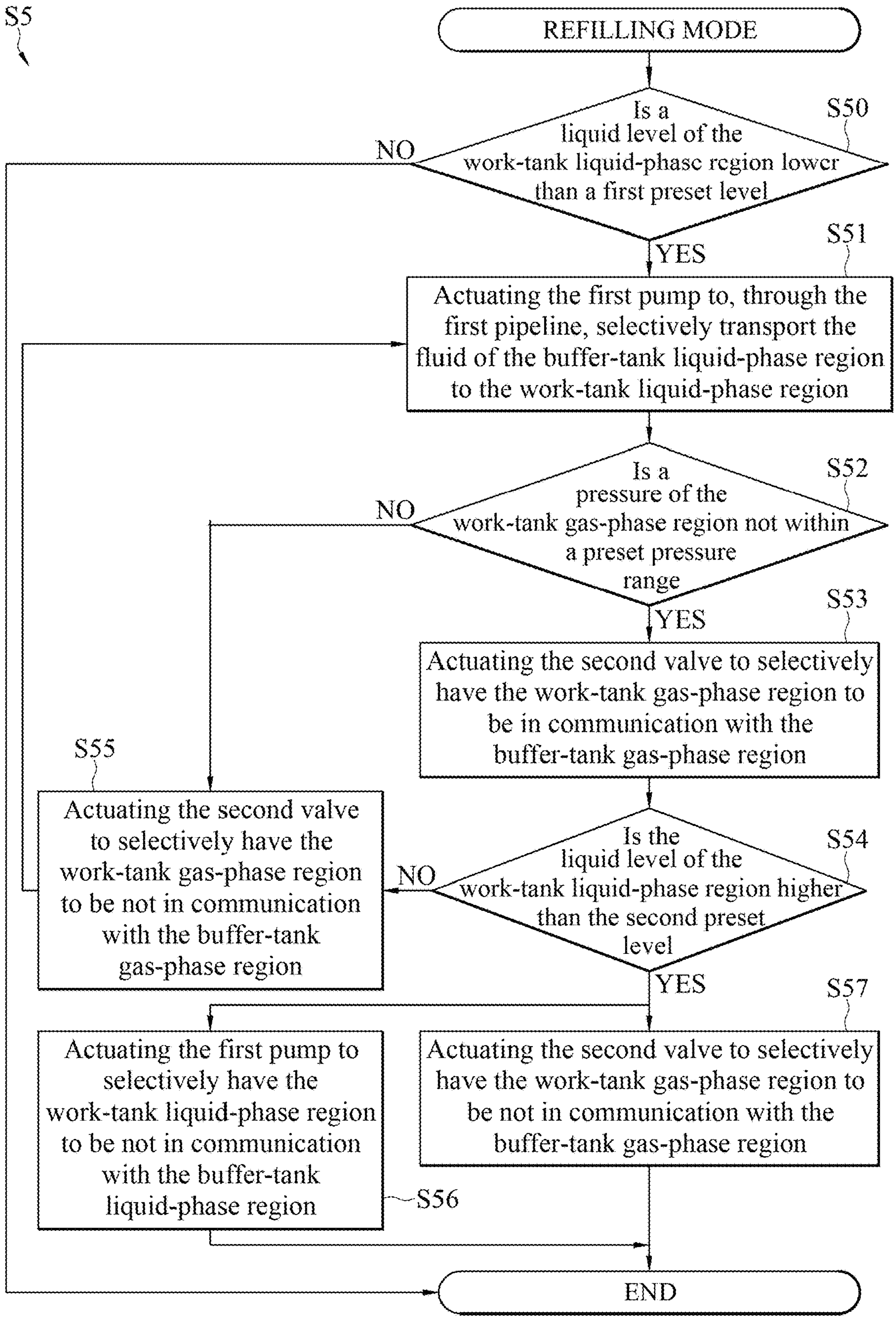
FIG. 5 illustrates a workflow chart of the immersion cooling system under the refilling mode according to some embodiments.

For example, the control unit 34 may set a preset liquid-level range based on the operation procedures or the device specification, where the preset liquid-level range may, for example, comprise a first preset level S1 (as shown in FIG. 1) and a second preset level S2 (as shown in FIG. 1 and will be described in detail later). The first preset level S1 may be set to be lower than the second preset level S2. In some embodiments, in response to that the control unit 34 determines that the liquid level H1 of the fluid 12 is lower than the first preset level S1, the control unit 34 then determines that the immersion cooling system 1 should launch a “refilling mode” (as shown in FIG. 5 and will be described in detail later) to transport the fluid 22 of the buffer-tank liquid-phase region L2 to the work-tank liquid-phase region L1, where the liquid level H1 of the fluid 12 can be further ensured to be at least higher than the first preset level S1 (or even higher than the second preset level S2).

Figure 6:
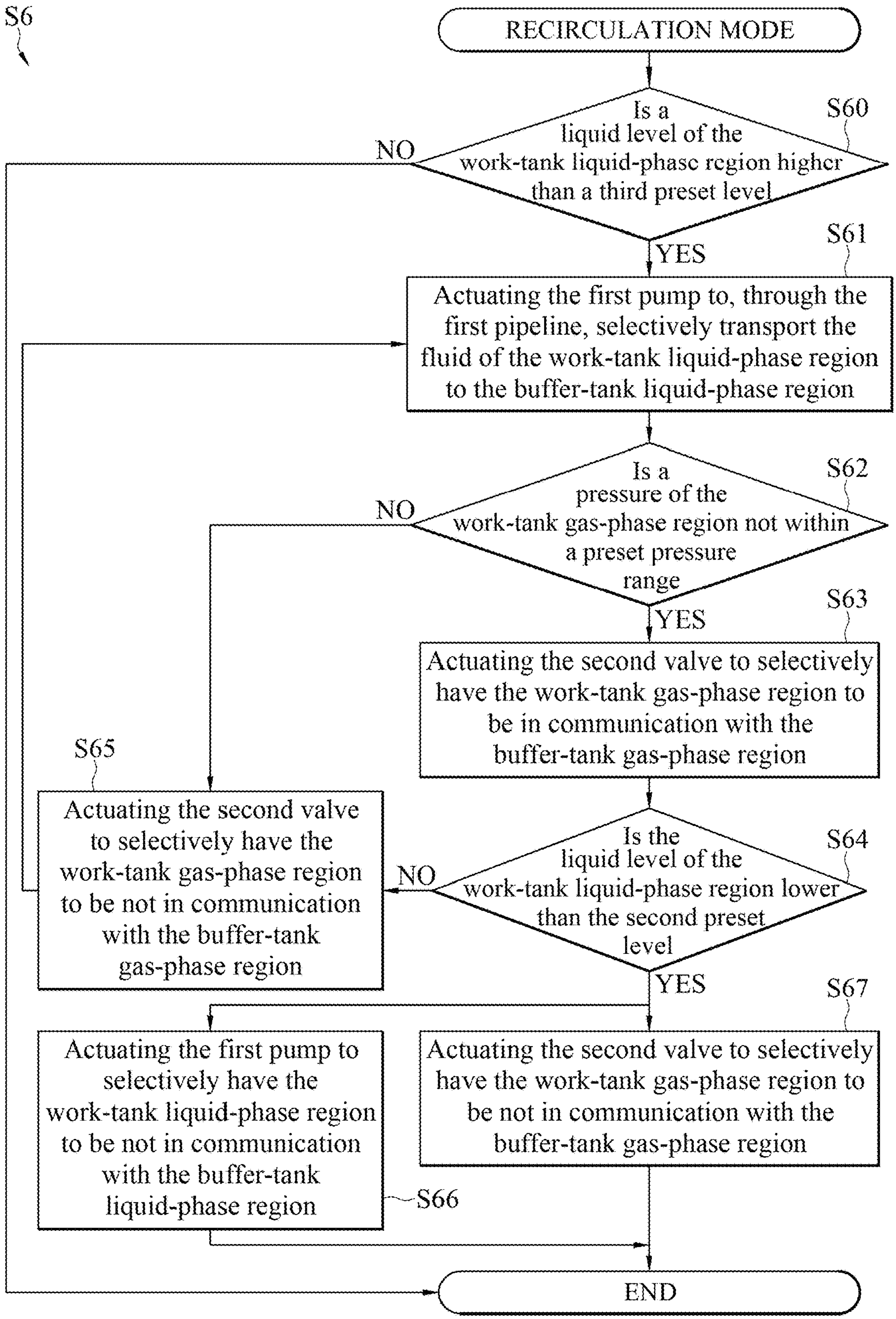
FIG. 6 illustrates a workflow chart of the immersion cooling system under the recirculation mode according to some embodiments.

For another example, the preset liquid-level range may further comprise a third preset level (not shown), where the third preset level is higher than the second preset level S2, and the second preset level S2 is higher than the first preset level S1. In some embodiments, in response to that the control unit 34 determines that the liquid level H1 of the fluid 12 is higher than the third preset level, the control unit 34 then determines that the immersion cooling system 1 should launch a “recirculation mode” (as shown in FIG. 6 and will be described in detail later) to transport the fluid 12 of the work-tank liquid-phase region L1 to the buffer-tank liquid-phase region L2, where the liquid level H1 of the fluid 12 can be further ensured to be at least lower than the third preset level (e.g., lower than the second preset level S2 but higher than the first preset level S1).

Please still refer to FIG. 1 and FIG. 2. According to some embodiments, the preset liquid-level range may be set based on the location levels of the connection ports P1, P2 of the work tank 10.

For example, the preset liquid-level range may comprise the first preset level S1 higher than the location level of the first connection port P1; that is, in some embodiments, the location level of the first connection port P1 is lower than or substantially equal to the first preset level S1. Hence, according to some embodiments, by monitoring the liquid level H1 of the fluid 12 of the work-tank liquid-phase region L1, a lowest possible liquid level of the fluid 12 of the work-tank liquid-phase region L1 can be controllably equal to or slightly lower than the first preset level S1, but not lower than the location level of the first connection port P1. Therefore, according to some embodiments, the work-tank liquid-phase region L1 can be ensured to have the liquid level H1 of the fluid 12 to be at least higher than the first connection port P1, so that the first pipeline 310 can be normally filled with the fluid 12.

For another example, the preset liquid-level range may comprise the second preset level S2, the third preset level (not shown) or both, and the second preset level S2 and the third preset level may be both set to be lower than the location level of the second connection port P2. Hence, according to some embodiments, by monitoring the liquid level H1 of the fluid 12 of the work-tank liquid-phase region L1, a highest possible liquid level of the fluid 12 of the work-tank liquid-phase region L1 can be controllably not higher than the second preset level S2, the third preset level or both, and thus the work-tank liquid-phase region L1 would not be higher than the location level of the second connection port P2. Therefore, according to some embodiments, the fluid 12 can be ensured not to be transported to the buffer tank 20 through the second pipeline 320, so that the determination of the control unit 34 and the action of the second valve 321 can be prevented from being further affected.

Please still refer to FIG. 1 and FIG. 3. According to some embodiments, the work tank 10 further comprises a work-tank pressure control assembly 14 at the work-tank body 11 and in communication with the work-tank gas-phase region V1. The work-tank pressure control assembly 14 may be any device with the function of pressure adjusting (e.g., a bellow). The work-tank pressure control assembly 14 is communicationally connected to the control unit 34 to receive the control signals from the control unit 34. The control unit 34 controls the work-tank pressure control assembly 14 to adjust the pressure of the work-tank gas-phase region V1. Hence, in addition to the second valve 321 and the second pipeline 320, the pressure of the work-tank gas-phase region V1 can also be adjusted through the work-tank pressure control assembly 14. Therefore, in response to that, for example, the pressure of the second valve 321 cannot be balanced in time or the second valve 321 cannot function normally, the pressure of the work-tank gas-phase region V1 can still be adjusted through the work-tank pressure control assembly 14. Accordingly, the cooling performance of the immersion cooling system 1 according to some embodiments can still be prevented from being affected, thereby preventing the immersion cooling system 1 from being damaged.

Figure 9:
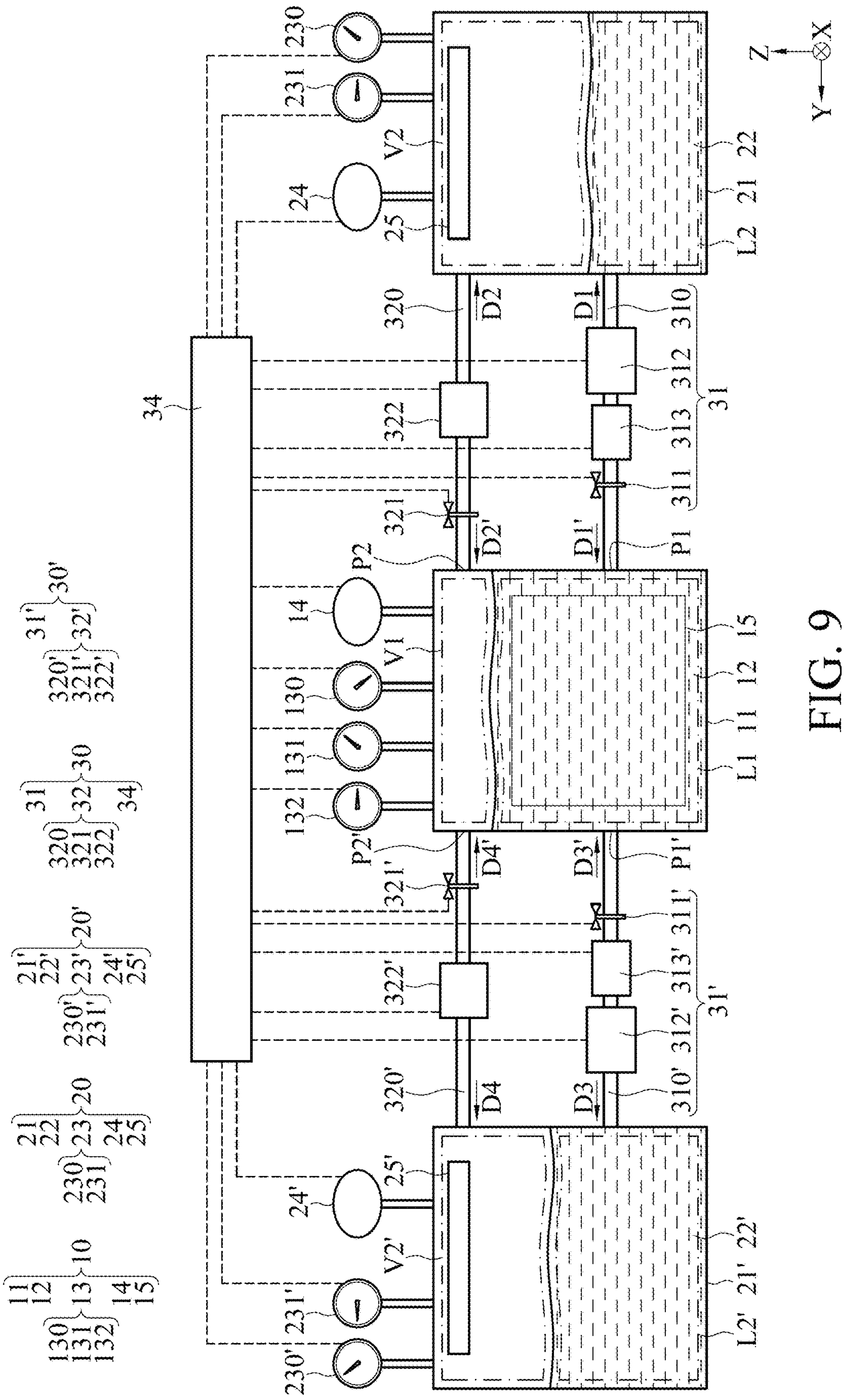
FIG. 9 illustrates a schematic structural view of an immersion cooling system according to some embodiments.

Please still refer to FIG. 1 and FIG. 3. According to some embodiments, the buffer tank 20 further comprises a buffer-tank sensing assembly 23 configured to sense the pressure of the buffer-tank gas-phase region V2 and the liquid level H2 of the buffer-tank liquid-phase region L2. The buffer-tank sensing assembly 23 is communicationally connected to the control unit 34 to receive the control signals from the control unit 34. The control unit 34 is configured to selectively actuate the second valve 321 to have the work-tank gas-phase region V1 to be in communication with the buffer-tank gas-phase region V2 based on the pressure relationship between the work-tank gas-phase region V1 and the buffer-tank gas-phase region V2. In some embodiments, the control unit 34 is configured to actuate the first pump 312 to transport the fluid 12 of the work-tank liquid-phase region L1 to the buffer-tank liquid-phase region L2, or to transport the fluid 22 of the buffer-tank liquid-phase region L2 to the work-tank liquid-phase region L1 (which will be described in detail later) based on the relationship between the liquid level H1 of the work-tank liquid-phase region L1 and the liquid level H2 of the buffer-tank liquid-phase region L2. Hence, by monitoring the pressure of the buffer-tank gas-phase region V2, the liquid level H2 of the buffer-tank liquid-phase region L2 or both, whether the corresponding buffer tank 20 is configured to be instantly in communication with the work tank can be firstly determined, which may be further used to determine whether to launch the "maintenance mode" (or even the "refilling mode" and the "recirculation mode", which will be described in detail later). In some embodiments, the immersion cooling system 1 may comprise a plurality of the buffer tanks 20, 20' (as shown in FIG. 9 and will be described in detail later). Hence, by monitoring the pressure of the buffer-tank gas-phase region V2, the liquid level H2 of the buffer-tank liquid-phase region L2 or both of each of the buffer tanks 20, 20', the most adequate buffer tank (e.g., the buffer tank 20') among the buffer tanks 20, 20' can be determined to conduct the maintenance mode (or even the refilling mode and the recirculation mode), thereby reducing the preparation time originally required for each mode (such as the time to wait for the fluid 22 of the buffer tank 20 to cool down).

Please still refer to FIG. 1 to FIG. 3. According to some embodiments, the buffer-tank sensing assembly 23 comprises a buffer-tank pressure sensor 230 configured to sense the pressure of the buffer-tank gas-phase region V2 and transmit the pressure of the buffer-tank gas-phase region V2 back to the control unit 34. The buffer-tank pressure sensor 230 may be any device with the function of pressure sensing (e.g., a pressure gauge) and in communication with the buffer-tank body 21 to sense the pressure of the buffer-tank gas-phase region V2. The control unit 34 obtains the pressure of the buffer-tank gas-phase region V2 through the buffer-tank pressure sensor 230. Depending upon the pressure of the buffer-tank gas-phase region V2, the control unit 34 may further transmit specific control signal(s) to actuate the related component(s); it is noted that embodiments thereof can be referred to the aforementioned embodiments, which are not further described in detail herein.

Please refer to FIG. 1 to FIG. 3. According to some embodiments, the buffer-tank sensing assembly 23 comprises a buffer-tank liquid-level sensor 231 configured to sense the liquid level H2 of the fluid 22 of the buffer-tank liquid-phase region L2 and transmit the liquid level H2 of the fluid 12 back to the control unit 34. The buffer-tank liquid-level sensor 231 may be any device with the function of liquid-level sensing (e.g., a liquid level sensor) and in communication with the buffer-tank body 21 to sense the liquid level H2 of the fluid 22 in the buffer-tank liquid-phase region L2. The control unit 34 obtains the liquid level H2 of the fluid 22 through the buffer-tank liquid-level sensor 231. Depending upon the liquid level H2 of the buffer-tank liquid-phase region L2, the control unit 34 may further transmit specific control signal(s) to actuate the related component(s); it is noted that embodiments thereof can be referred to the aforementioned embodiments, which are not further described in detail herein.

Please still refer to FIG. 1 and FIG. 3. According to some embodiments, the buffer tank 20 further comprises a buffer-tank pressure control assembly 24 at the buffer-tank body 21 and in communication with the buffer-tank gas-phase region V2. The buffer-tank pressure control assembly 24 may be any device with the function of pressure adjusting (e.g., a bellow). The buffer-tank pressure control assembly 24 is communicationally connected to the control unit 34 to receive the control signals from the control unit 34. The control unit 34 controls the buffer-tank pressure control assembly 24 to adjust the pressure of the buffer-tank gas-phase region V2.

Some embodiments of the "maintenance mode" are described as follows.

Please refer to FIG. 1, FIG. 2, and FIG. 4. FIG. 4 illustrates a workflow chart of the immersion cooling system 1 under the maintenance mode according to some embodiments. In the maintenance procedure S4 shown in FIG. 4, when the immersion cooling system 1 launches the "maintenance mode", in the step S40, the control unit 34 obtains the temperature of the work-tank liquid-phase region L1, and the control unit 34 then determines whether the temperature of the work-tank liquid-phase region L1 is greater than the preset temperature.

In response to that the determination made by the control unit 34 in the step S40 is "NO" (i.e., the temperature is not greater than the preset temperature), the immersion cooling system 1 launches the "lid-open mode" (or else mode) or continue proceeding the cooling procedure without being affected.

In response to that the determination made by the control unit 34 in the step S40 is "YES" (i.e., the temperature is greater than the preset temperature), in the step S41, the control unit 34 actuates the first pump 312 to selectively, through the first pipeline 310, transport the fluid 12 of the work-tank liquid-phase region L1 to the buffer-tank liquid-phase region L2 or transport the fluid 22 of the buffer-tank liquid-phase region L2 to the work-tank liquid-phase region L1.

In some embodiments, the transportation procedures of the fluid 12 and the fluid 22 may be conducted simultaneously or sequentially.

For example, in some embodiments, the first control assembly 31 comprises only a single pipeline configured to transport the fluid 12, the fluid 22 or both, such as the first pipeline 310 (as shown in FIG. 1). The pipeline may be provided to transport the fluid 12 and the fluid 22 sequentially; for example, the fluid 12 is firstly transported to the buffer-tank liquid-phase region L2, or the fluid 22 is firstly transported to the work-tank liquid-phase region L1. Hence, by transporting the fluid 12 to the buffer tank 20 and transporting the fluid 22 with a lower temperature to the work tank 10 in time, the fluid 12 of the work-tank liquid-phase region L1 can be cooled efficiently, so that the required time to wait for the work tank 10 to cool down can be reduced (as compared with the required time to wait for the work tank known to the inventors to cool down), thereby reducing the cooling costs thereof.

For another example, the first control assembly 31 may comprise a plurality of pipelines, such as the first pipeline 310 and the third pipeline 330 (as shown in FIG. 7 and will be described in detail later). At least one of the pipelines is configured to transport the fluid 12 of the work-tank liquid-phase region L1 to the buffer-tank liquid-phase region L2; regardless of the sequence (i.e., simultaneously, before, or after), at least one of the remaining pipelines is configured to transport the fluid 22 of the buffer-tank liquid-phase region L2 to the work-tank liquid-phase region L1. Hence, according to some embodiments, through the pipelines configured to transport the fluid 12, the fluid 22 or both, the fluid 12 with a higher temperature can be replaced by the fluid 12 with a lower temperature in a reduced time, so that the required time to wait for the work tank 10 to cool down can be reduced (as compared with the required time to wait for the work tank known to the inventors to cool down), thereby reducing the cooling costs thereof.

Simultaneously or after the step S41, the control unit 34 obtains the pressure of the work-tank gas-phase region V1; and in the step S42, the control unit 34 then determines whether the pressure of the work-tank gas-phase region V1 is not within the preset pressure range.

In response to that the determination made by the control unit 34 in the step S42 is "NO" (i.e., the pressure is within the preset pressure range), the procedure returns to the step S41 to continue the transportation of the fluid 12, the fluid 22 or both.

In response to that the determination made by the control unit 34 in the step S42 is "YES" (i.e., the pressure is not within the preset pressure range), in the step S43, the control unit 34 actuates the second valve 321 to selectively, through the second pipeline 320, have the work-tank gas-phase region V1 to be in communication with the buffer-tank gas-phase region V2. In some embodiments, in response to that the pressure of the work-tank gas-phase region V1 is determined to be not within and less than the preset pressure range, in the step S43, the control unit 34 actuates the second valve 321. Due to the pressure difference or the actuation by the second pump (not shown), in the step S43, the gas-phase mixing fluid of the buffer-tank gas-phase region V2 would be transported to the work-tank gas-phase region V1 through the second pipeline 320. In some embodiments, in response to that the work-tank gas-phase region V1 is determined to be not within and greater than the preset pressure range, in the step S43, the control unit 34 actuates the second valve 321. Due to the pressure difference or the actuation by the second pump (not shown), in the step S43, the gas-phase mixing fluid of the work-tank gas-phase region V1 would be transported to the buffer-tank gas-phase region V2 through the second pipeline 320.

In some embodiments, simultaneously or after step S43, the control unit 34 still obtains the liquid level H1 of the work-tank liquid-phase region L1. Next, the procedure may selectively execute the step S44 (as shown in FIG. 4) or the step S46 directly (i.e., the step S44 is omitted from the procedure).

If the procedure selectively executes the step S44, in the step S44, the control unit 34 then determines whether the liquid level H1 of the work-tank liquid-phase region L1 is lower than the first preset level S1.

In response to that the determination made by the control unit 34 in the step S44 is "YES" (i.e., the liquid level H1 is lower than the first preset level S1), the procedure would then execute the step S45 or the step S41 (i.e., the step S45 is omitted from the procedure). In the step S45, the control unit 34 actuates the second valve 321 to selectively have the work-tank gas-phase region V1 to be not in communication with the buffer-tank gas-phase region V2; for example, the control unit 34 actuates the second valve 321 to selectively have the second valve 321 to be shut off to prevent the gas-phase mixing fluid from flowing between the work-tank gas-phase region V1 and the buffer-tank gas-phase region V2. At the same time, the first pump 312 may be selectively not actuated to have the first pipeline 310 to be still in a communication state; or the first pump 312 may be selectively actuated to have the first pipeline 310 to be not in a communication state. Subsequently, the procedure would return to the step S41 to continue the transportation of the fluid 12, the fluid 22 or both.

In response to that the determination made by the control unit 34 in the step S44 is "NO" (i.e., the liquid level H1 is higher than or equal to the first preset level S1, as shown in FIG. 1), the procedure would then execute the step S46, and in the step S46, the control unit 34 then determines whether the liquid level H1 of the work-tank liquid-phase region L1 is higher than the second preset level S2, where the second preset level S2 may be higher than or equal to the first preset level S1.

In response to that the determination made by the control unit 34 in the step S46 is "NO" (i.e., the liquid level H1 is lower than or equal to the second preset level S2), the procedure would then return to the step S45 and the step S41 to continue the transportation of the fluid 12, the fluid 22 or both until the liquid level H1 is higher than the second preset level S2 and the determination in the step S46 is "YES".

In response to that the determination made by the control unit 34 in the step S46 is "YES" (i.e., the liquid level H1 is higher than the second preset level S2), the procedure would then execute the step S47, and in the step S47, the control unit 34 actuates the first pump 312 to selectively have the work-tank liquid-phase region L1 to be in communication with the buffer-tank liquid-phase region L2; regardless of the sequence, in the step S48, the control unit 34 actuates the second valve 321 to selectively have the work-tank gas-phase region V1 to be not in communication with the buffer-tank gas-phase region V2. At this stage, the work tank and the buffer tank 20 are not in communication with each other, and the work tank 10 of the immersion cooling system 1 would launch the "lid-open mode" (or else mode) or continue proceeding the cooling procedure of the component(s) to be cooled 15 without being affected.

In some embodiments where the step S44 is omitted from the procedure, the control unit 34 determines, merely in the step S46, whether the liquid level H1 is higher than the second preset level S2. In response to that the liquid level H1 is slightly higher than or equal to the second preset level S2, the step S46 may be determined to be completed. In such embodiments, the control unit 34 would frequently determine that the liquid level H1 is not high enough and thus need to frequently launch the "maintenance mode" or the "refilling mode" (which will be described in detail later). In other words, in such embodiments, the tolerance range regarding the level difference for the determination by the control unit 34 is relatively narrower.

In contrast, in some embodiments where the step S44 is included, the control unit 34 has to firstly determine whether the liquid level H1 is lower than the first preset level S1 and then directly increases the liquid level H1 at least from the first preset level S1 to the second preset level S2. In other words, in some embodiments, in response to that the second preset level S2 is excessively higher than the first preset level S1, the tolerance range regarding the level difference (i.e., the difference between the second preset level S2 and the first preset level S1) for the determination by the control unit 34 is relatively larger. Hence, in such embodiments, by setting the first preset level S1 and the second preset level S2 properly, the control unit 34 can be prevented from frequently determining that the liquid level H1 is not high enough, and thus the operation time between the current "maintenance mode" and the next "maintenance mode" (or the "refilling mode", which will be described in detail later) can be further prolonged.

Accordingly, in some embodiments, before the immersion cooling system 1 launches the "lid-open mode" or else mode, by transporting the fluid 12 with a higher temperature in the work tank 10 rapidly to the buffer tank 20 (or with the aid of further transporting the fluid 22 with a lower temperature in the buffer tank 20 to the work tank 10), the required time to wait for the work tank 10 to cool down can be reduced (as compared with the required time to wait for the work tank known to the inventors to cool down), thereby reducing the operation time and costs thereof.

Some embodiments of the "refilling mode" are described as follows.

Please refer to FIG. 1, FIG. 2, and FIG. 5. FIG. 5 illustrates a workflow chart of the immersion cooling system 1 under the refilling mode according to some embodiments. The "refilling mode" may be conducted under the "maintenance mode" shown in FIG. 4; for example, be conducted in the step S44 shown in FIG. 4. It is noted that, according to some embodiments, at this stage, the control unit 34 may selectively actuate the second valve 321 to at least have the work-tank gas-phase region V1 to be not in communication with the buffer-tank gas-phase region V2 before launching the "refilling mode". According to some other embodiments, the "refilling mode" may be conducted independently from the "maintenance mode", which is not particularly limited herein.

In the refilling procedure S5 shown in FIG. 5, when the immersion cooling system 1 launches the "refilling mode", in the step S50, the control unit 34 obtains the liquid level H1 of the work-tank liquid-phase region L1, and the control unit 34 then determines whether the liquid level H1 of the work-tank liquid-phase region L1 is lower than the first preset level S1.

In response to that the determination made by the control unit 34 in the step S50 is "NO" (i.e., the liquid level H1 is higher than or equal to the first preset level S1, as shown in FIG. 1), the immersion cooling system 1 may then launch else mode (such as the "lid-open mode") or continue proceeding the cooling procedure of the component(s) to be cooled 15 without being affected.

In response to that the determination made by the control unit 34 in the step S50 is "YES" (i.e., the liquid level H1 is lower than the first preset level S1, as shown in FIG. 2), the procedure would then execute the step S51, and in the step S51, the control unit 34 actuates the first pump 312 to be in communication with the first pipeline 310 and selectively, through the first pipeline 310, transport the fluid 22 of the buffer-tank liquid-phase region L2 to the work-tank liquid-phase region L1. At the same time (i.e., before the step S52 is executed), the control unit 34 would at least actuate the second valve 321 to have the work-tank gas-phase region V1 to be not in communication with the buffer-tank gas-phase region V2 through the second pipeline 320.

Simultaneously or after the step S51, the control unit 34 obtains the pressure of the work-tank gas-phase region V1. In the step S52, the control unit 34 determines whether the pressure of the work-tank gas-phase region V1 is not within the preset pressure range.

In response to that the determination made by the control unit 34 in the step S52 is "NO" (i.e., the pressure is within the preset pressure range), the procedure would return to the step S51 to continue the transportation of the fluid 22 to the work-tank liquid-phase region L1.

In response to that the determination made by the control unit 34 in the step S52 is "YES" (i.e., the pressure is not within the preset pressure range), the procedure would then execute the step S53, and in the step S53, the control unit 34 actuates the second valve 321 to selectively, through the second pipeline 320, have the work-tank gas-phase region V1 to be in communication with the buffer-tank gas-phase region V2. In some embodiments, in response to that the pressure of the work-tank gas-phase region V1 is determined to be not within and greater than the preset pressure range, in the step S53, the control unit 34 actuates the second valve 321. Due to the pressure difference or the actuation by the second pump (not shown), in the step S53, the gas-phase mixing fluid of the work-tank gas-phase region V1 would be transported to the buffer-tank gas-phase region V2 through the second pipeline 320. In some embodiments, in response to that the work-tank gas-phase region V1 is determined to be not within and less than the preset pressure range, in the step S53, the control unit 34 actuates the second valve 321. Due to the pressure difference or the actuation by the second pump (not shown), in the step S53, the gas-phase mixing fluid of the buffer-tank gas-phase region V2 would be transported to the work-tank gas-phase region V1 through the second pipeline 320.

In some embodiments, simultaneously or after the step S53, the control unit 34 still obtains the liquid level H1 of the work-tank liquid-phase region L1. In the step S54, the control unit 34 determines whether the liquid level H1 of the work-tank liquid-phase region L1 is higher than the second preset level S2 (and higher than or equal to the first preset level S1).

In response to that the determination made by the control unit 34 in the step S54 is "NO" (i.e., the liquid level H1 is lower than or equal to the second preset level S2), the procedure would then execute the step S55 or the step S51 (i.e., the step S55 is omitted from the procedure). In the step S55, the control unit 34 actuates the second valve 321 to selectively have the work-tank gas-phase region V1 to be not in communication with the buffer-tank gas-phase region V2. The procedure would return to the step S51 to continue the transportation of the fluid 22 to the work-tank liquid-phase region L1.

In response to that the determination made by the control unit 34 in the step S54 is "YES" (i.e., the liquid level H1 is higher than the second preset level S2, as shown in FIG. 1), the procedure would then execute the step S56, and in the step S56, the control unit 34 actuates the first pump 312 to selectively have the work-tank liquid-phase region L1 to be in communication with the buffer-tank liquid-phase region L2. In some embodiments, the second preset level S2 is further set to be lower than the location level of the second connection port P2 to ensure that the fluid 12 would not be transported to the second pipeline 320. Regardless of the sequence, in the step S57, the control unit 34 actuates the second valve 321 to selectively have the work-tank gas-phase region V1 to be not in communication with the buffer-tank gas-phase region V2. At this stage, the work tank 10 and the buffer tank 20 are not in communication with each other, and the work tank 10 may then launch the "refilling mode". At this stage, the work tank 10 may otherwise launch else mode (such as the "lid-open mode") or continue proceeding the cooling procedure of the component(s) to be cooled 15 without being affected.

Please refer to FIG. 1 and FIG. 6. FIG. 6 illustrates a workflow chart of the immersion cooling system 1 under the recirculation mode according to some embodiments. The "recirculation mode" may be conducted under the "maintenance mode" shown in FIG. 4; for example, be conducted in the step S46 shown in FIG. 4. It is noted that, according to some embodiments, at this stage, the control unit 34 may selectively actuate the second valve 321 to at least have the work-tank gas-phase region V1 to be not in communication with the buffer-tank gas-phase region V2 before launching the "recirculation mode". According to some other embodiments, the "recirculation mode" may be conducted independently from the "maintenance mode", which is not particularly limited herein.

In the recirculation procedure S6 shown in FIG. 6, when the immersion cooling system 1 launches the "recirculation mode", in the step S60, the control unit 34 obtains the liquid level H1 of the work-tank liquid-phase region L1, and the control unit 34 then determines whether the liquid level H1 of the work-tank liquid-phase region L1 is higher than the third preset level (not shown), where the third preset level is higher than or equal to the second preset level S2, and the second preset level S2 is higher than or equal to the first preset level S1. In some embodiments, the third preset level is further set to be lower than the location level of the second connection port P2 to ensure that the fluid 12 would not be transported to the second pipeline 320 by monitoring the liquid level H1 of the work-tank liquid-phase region L1.

In response to that the determination made by the control unit 34 in the step S60 is "NO" (i.e., the liquid level H1 is lower than or equal to the third preset level), the immersion cooling system 1 may then launch else mode (such as the "lid-open mode") or continue proceeding the cooling procedure of the component(s) to be cooled 15 without being affected.

In response to that the determination made by the control unit 34 in the step S60 is "YES" (i.e., the liquid level H1 is higher than the third preset level), the procedure would then execute the step S61, and in the step S61, the control unit 34 actuates the first pump 312 to be in communication with the first pipeline 310 and selectively, through the first pipeline 310, transport the fluid 12 of the work-tank liquid-phase region L1 to the buffer-tank liquid-phase region L2. At the same time (i.e., before the step S62 is executed), the control unit 34 would at least actuate the second valve 321 to have the work-tank gas-phase region V1 to be not in communication with the buffer-tank gas-phase region V2 through the second pipeline 320.

In some embodiments, simultaneously or after the step S61, the control unit 34 still obtains the pressure of the work-tank gas-phase region V1. In the step S62, the control unit 34 determines whether the pressure of the work-tank gas-phase region V1 is not within the preset pressure range.

In response to that the determination made by the control unit 34 in the step S62 is "NO" (i.e., the pressure complies with the preset pressure range), the procedure would return to the step S61 to continue the transportation of the fluid 12 to the buffer-tank liquid-phase region L2.

In response to that the determination made by the control unit 34 in the step S62 is "YES" (i.e., the pressure is not within the preset pressure range), the procedure would then execute the step S63, and in the step S63, the control unit 34 actuates the second valve 321 to selectively, through the second pipeline 320, have the work-tank gas-phase region V1 to be in communication with the buffer-tank gas-phase region V2. In some embodiments, in response to that the pressure of the work-tank gas-phase region V1 is determined to be not within and less than the preset pressure range, in the step S63, the control unit 34 actuates the second valve 321. Due to the pressure difference or the actuation by the second pump (not shown), in step S63, the gas-phase mixing fluid of the buffer-tank gas-phase region V2 would be transported to the work-tank gas-phase region V1 through the second pipeline 320. In some embodiments, in response to that the work-tank gas-phase region V1 is determined to be not within and greater than the preset pressure range, in the step S63, the control unit 34 actuates the second valve 321. Due to the pressure difference or the actuation by the second pump (not shown), in the step S63, the gas-phase mixing fluid of the work-tank gas-phase region V1 would be transported to the buffer-tank gas-phase region V2 through the second pipeline 320.

In some embodiments, simultaneously or after the step S63, the control unit 34 still obtains the liquid level H1 of the work-tank liquid-phase region L1. In the step S64, the control unit 34 determines whether the liquid level H1 of the work-tank liquid-phase region L1 is lower than the second preset level S2.

In response to that the determination made by the control unit 34 in the step S64 is "NO" (i.e., the liquid level H1 is higher than or equal to the second preset level S2, as shown in FIG. 1), the procedure would then execute the step S65 or the step S61 (i.e., the step S65 is omitted from the procedure). In the step S65, the control unit 34 actuates the second valve 321 to selectively have the work-tank gas-phase region V1 to be not in communication with the buffer-tank gas-phase region V2. The procedure would return to the step S61 to continue the transportation of the fluid 12 to the buffer-tank liquid-phase region L2.

In response to that the determination made by the control unit 34 in the step S64 is "YES" (i.e., the liquid level H1 is lower than the second preset level S2), the procedure would then execute the step S66, and in the step S66, the control unit 34 actuates the first pump 312 to selectively have the work-tank liquid-phase region L1 to be in communication with the buffer-tank liquid-phase region L2. Regardless of the sequence, in the step S67, the control unit 34 actuates the second valve 321 to selectively have the work-tank gas-phase region V1 to be not in communication with the buffer-tank gas-phase region V2. At this stage, the work tank and the buffer tank 20 are not in communication with each other, and the "recirculation mode" may be determined to be completed. At this stage, the work tank 10 may launch else mode (such as the "lid-open mode") or continue proceeding the cooling procedure of the component(s) to be cooled 15 without being affected.

Please refer to FIG. 3, FIG. 7, and FIG. 8. FIG. 7 illustrates a schematic structural view of an immersion cooling system 1 according to some embodiments, wherein the immersion cooling system 1 is under a first operation state. FIG. 8 illustrates a schematic structural view of the immersion cooling system 1 shown in FIG. 7, wherein the immersion cooling system 1 is under a second operation state. The immersion cooling systems 1 shown in FIG. 7 and FIG. 8 are basically identical to the immersion cooling systems 1 shown in FIG. 1 and FIG. 2, and the difference thereof, for example, is: in FIG. 7 and FIG. 8, in addition to the first control assembly 31 and the second control assembly 32, the communication control assembly 30 further comprises a third control assembly 33. In FIG. 7 and FIG. 8, the first control assembly 31 may also comprise a first pipeline 310, a first valve 311, a first pump 312, and a first filtration element 313; the second control assembly 32 may also comprise a second pipeline 320, a second valve 321, and a dehumidification portion 322; and embodiments of each of the components can be referred to the aforementioned embodiments, which are not further described in detail herein.

In FIG. 7 and FIG. 8, the third control assembly 33 may comprise a third pipeline 330, a third valve 331, and a third pump 332.

Please still refer to FIG. 7 and FIG. 8. According to some embodiments, one of two ends of the third pipeline 330 may be directly in communication with the work-tank liquid-phase region L1, while the other of two ends of the third pipeline 330 may be directly in communication with the buffer-tank liquid-phase region L2. For example, in FIG. 7, one of two ends of the third pipeline 330 is in communication with the upper portion of the work-tank liquid-phase region L1 through a third connection port P3, while the other of two ends of the third pipeline 330 is in communication with the buffer-tank liquid-phase region L2 (e.g., the upper portion of the buffer-tank liquid-phase region L2). In addition, one of two ends of the first pipeline 310 is in communication with the lower portion of the work-tank liquid-phase region L1 through the first connection port P1, while the other of two ends of the first pipeline 310 is in communication with the buffer-tank liquid-phase region L2 (e.g., the lower portion of the buffer-tank liquid-phase region L2). In some embodiments, the location level of the third connection port P3 is higher than the location level of the first connection port P1, and the location level of the second connection port P2 is higher than the location level of the third connection port P3. Hence, in FIG. 7, the fluid 12 at the upper portion of the work-tank liquid-phase region L1 and the fluid 22 of the buffer-tank liquid-phase region L2 may be directly, through the third connection port P3, transported between the work-tank liquid-phase region L1 and the buffer-tank liquid-phase region L2. The fluid 12 at the lower portion of the work-tank liquid-phase region L1 and the fluid 22 of the buffer-tank liquid-phase region L2 may be directly, through the first connection port P1, transported between the work-tank liquid-phase region L1 and the buffer-tank liquid-phase region L2.

Due to the physical and chemical properties of the working fluid, the fluid 12 with a higher temperature would flow to the upper portion of the work-tank liquid-phase region L1; in contrast, the fluid 12 with a lower temperature would collect at the lower portion of the work-tank liquid-phase region L1. Hence, through the third pipeline 330 and the third connection port P3, the fluid 12 with a higher temperature can be transported to the buffer-tank liquid-phase region L2 more efficiently and rapidly, and the fluid 12 with a lower temperature can be kept in the work-tank liquid-phase region L1. Therefore, according to some embodiments, through the third pipeline 330 and the third connection port P3, the fluid 12 of the work-tank liquid-phase region L1 can be cooled more efficiently and rapidly, thereby greatly reducing the cooling time of the fluid 12.

In addition, in FIG. 7 and FIG. 8, according to some embodiments, through the first pipeline 310 and the first connection port P1, the fluid 22 with a lower temperature of the buffer-tank liquid-phase region L2 can be transported to the lower portion of the work-tank liquid-phase region L1, so that the fluid 22 can be prevented from directly contacting the upper portion of the work-tank liquid-phase region L1. Therefore, according to some embodiments, through the first pipeline 310 and the first connection port P1, the total amount of the fluid 12 with a lower temperature can be increased more efficiently.

Please still refer to FIG. 7 and FIG. 8. According to some embodiments, the first pipeline 310 and the third pipeline 330 may be simultaneously or sequentially used (i.e., there is a sequence, but which pipeline is used first while which pipeline is used later is not particularly limited herein) to conduct the aforementioned replacement between the fluid 12 and the fluid 22 at the lower portion (with a lower temperature) and at the upper portion (with a high temperature), so that the fluid 12 with a higher temperature can be replaced by the fluid 12 with a lower temperature more rapidly.

Moreover, the third control assembly 33 shown in FIG. 3, FIG. 7, and FIG. 8 may be arranged basically by referring to the first control assembly 31 shown in FIG. 1 to FIG. 3, and thus embodiments thereof can be referred to the aforementioned embodiments.

In other words, please refer to FIG. 3, FIG. 7, and FIG. 8. According to some embodiments, the control unit 34 is configured to, in response to that the temperature of the work-tank liquid-phase region L1 is greater than a preset temperature under a maintenance mode, actuate the first pump 312 to transport the fluid 22 of the buffer-tank liquid-phase region L2 to the work-tank liquid-phase region L1, and the control unit 34 is configured to actuate the third pump 332 to transport the fluid 12 of the work-tank liquid-phase region L1 to the buffer-tank liquid-phase region L2.

Please refer to FIG. 3, FIG. 7, and FIG. 8. According to some embodiments, the work-tank sensing assembly 13 is configured to sense the liquid level H1 of the work-tank liquid-phase region L1; and the control unit 34 is further configured to, in response to that the liquid level H1 of the work-tank liquid-phase region L1 is lower than the first preset level S1 under the maintenance mode, actuate the second valve 321 to have the work tank 10 to be not in communication with the buffer tank 20 and not actuate the first pump 312. Embodiments of the first preset level S1 can be referred to the aforementioned embodiments, which are not further described in detail herein.

Please still refer to FIG. 3, FIG. 7, and FIG. 8. According to some embodiments, the control unit 34 is configured to, under a refilling mode, actuate the second valve 321 to have the work-tank gas-phase region V1 to be not in communication with the buffer-tank gas-phase region V2, actuate the first pump 312 to transport the fluid 22 of the buffer-tank liquid-phase region L2 to the work-tank liquid-phase region L1, and actuate the third pump 332 to transport the fluid 12 of the work-tank liquid-phase region L1 to the buffer-tank liquid-phase region L2 until the liquid level H1 of the work-tank liquid-phase region L1 is higher than, for example, the second preset level S2.

Please still refer to FIG. 3, FIG. 7, and FIG. 8. According to some embodiments, the third control assembly 33 further comprises a third filtration element 333 at the third pipeline 330 and between the work tank 10 and the buffer tank 20. The third filtration element 333 may be between the work tank 10 and the third pump 332 (as shown in FIG. 7) or between the third pump 332 and the buffer tank 20. The third filtration element 333 may be arranged similarly to the first filtration element 313, and thus embodiments of the third filtration element 333 can be referred to the aforementioned embodiments of the first filtration element 313, which are not further described in detail herein.

In some embodiments, the immersion cooling system 1 comprises not only one work tank 10 but also a plurality of work tanks (e.g., the work tanks 10, 10' shown in FIG. 10, which will be described in detail later). In some other embodiments, the immersion cooling system 1 comprises not only one buffer tank 20 but also a plurality of buffer tanks (e.g., the buffer tanks 20, 20' shown in FIG. 9, which will be described in detail later). Hence, according to some embodiments, the arrangement of the work tank(s) 10 and the buffer tank(s) 20 may be adjusted depending upon various cooling demands to achieve corresponding cooling performance, so that the required time to wait for the work tank 10 to cool down can be reduced (as compared with the required time to wait for the work tank known to the inventors to cool down), thereby reducing the cooling costs thereof.

For example, please refer to FIG. 9. FIG. 9 illustrates a schematic structural view of an immersion cooling system 1 according to some embodiments. In FIG. 9, the immersion cooling system 1 may comprise a plurality of buffer tanks 20, 20'. Through the first pipeline 310 (or 310') at the first connection port P1 (or P1') corresponding to the buffer tank 20 (or 20'), selectively, the fluid 12 of the work-tank liquid-phase region L1 may be transported to at least one of the buffer-tank liquid-phase regions L2, L2' or the fluid 22 (or 22') in at least one of the buffer-tank liquid-phase regions L2, L2' may be transported to the work-tank liquid-phase region L1. The buffer-tank gas-phase region V2 of the buffer tank 20 is selectively, through the second pipeline 320 at the second connection port P2, in communication or not in communication with the work-tank gas-phase region V1 of the work tank 10; and the buffer-tank gas-phase region V2' of the buffer tank 20' is selectively, through the second pipeline 320' at the second connection port P2', in communication or not in communication with the work-tank gas-phase region V1 of the work tank 10. Embodiments of the buffer tank 20' (which may comprise a buffer-tank body 21', a fluid 22', a buffer-tank sensing assembly 23', a buffer-tank pressure control assembly 24', and a dehumidification assembly 25', wherein the buffer-tank sensing assembly 23' may comprise a buffer-tank pressure sensor 230' and a buffer-tank liquid-level sensor 231', and the buffer-tank sensing assembly 23' may have a buffer-tank gas-phase region V2' and a buffer-tank liquid-phase region L2') and the communication control assembly 30' (which may comprise a first control assembly 31' and a second control assembly 32', wherein the first control assembly 31' may comprise a first pipeline 310', a first valve 311', a first pump 312', and a first filtration element 313', and the second control assembly 32' may comprise a second pipeline 320', a second valve 321', and a dehumidification portion 322') can be referred to the aforementioned embodiments, which are not further described in detail herein. Moreover, it is noted that, according to some embodiments, the immersion cooling system 1 also comprises the aforementioned component(s) either shown in FIG. 9 or not and not particularly limited to the embodiments shown in FIG. 9.

In some embodiments, the first pipelines 310, 310' are in communication with an adapter pipeline to be selectively in communication with the work tank 10 through the adapter pipeline. For example, the adapting pipeline is a T-joint having three connection ports, where one of the three connection ports is in communication with the first pipeline 310, another of the three connection ports is in communication with the first pipeline 310', and the other of the three connection ports is in communication with the work-tank liquid-phase region L1 of the work tank 10, so that the overall structure of the work tank 10 can be simplified. Therefore, according to some embodiments, the fluid 12, the fluids 22, 22' or both in the first pipelines 310, 310' can be collected before being transported through the adapter pipeline, which can not only simplify the cooling procedure but also make the flow rate of the fluid 12, the fluids 22, 22' or both more stable.

In some embodiments, the control unit 34 is communicationally connected to a plurality of the buffer tanks 20, 20' to actuate the first control assemblies 31, 31', the second control assemblies 32, 32' or both depending upon the real-time state (e.g., the pressure and/or the liquid level) of each of the buffer tanks 20, 20' to selectively have the work tank 10 to be in communication with at least one of the buffer tanks 20, 20'. For example, in FIG. 9, the control unit 34 would selectively have the buffer-tank liquid-phase region L2' of the buffer tank with the liquid level being lower than the liquid level of the work 10 (e.g., the buffer tank 20' shown in FIG. 9) to be in communication with the work-tank liquid-phase region L1 of the work tank 10, so that the fluid 22' (and/or the fluid 12) would be transported inside the first pipeline 310' along the third direction D3' (and/or the third direction D3). At the same time, the control unit 34 would selectively have the buffer-tank gas-phase region V2' of the buffer tank with the pressure being greater than the pressure of the work tank 10 (e.g., the buffer tank 20' shown in FIG. 9) to be in communication with the work-tank gas-phase region V1 of the work tank 10, so that the gas-phase mixing fluid would be transported inside the second pipeline 320' along the fourth directions D4, D4'. Hence, the work tank 10 can be instantly connected to at least one of the buffer tanks 20, 20' that is the most suitable under different reference standards (e.g., the real-time status of each of the buffer tanks 20, 20'). Therefore, according to some embodiments, it can be ensured that the fluid 12 in the work tank 10 is consistently kept at a low temperature, and thus not only proper cooling performance can be provided, but also the cooling time required for the work tank 10 to cool down can be reduced (as compared with the required time to wait for the work tank known to the inventors).

Figure 10:
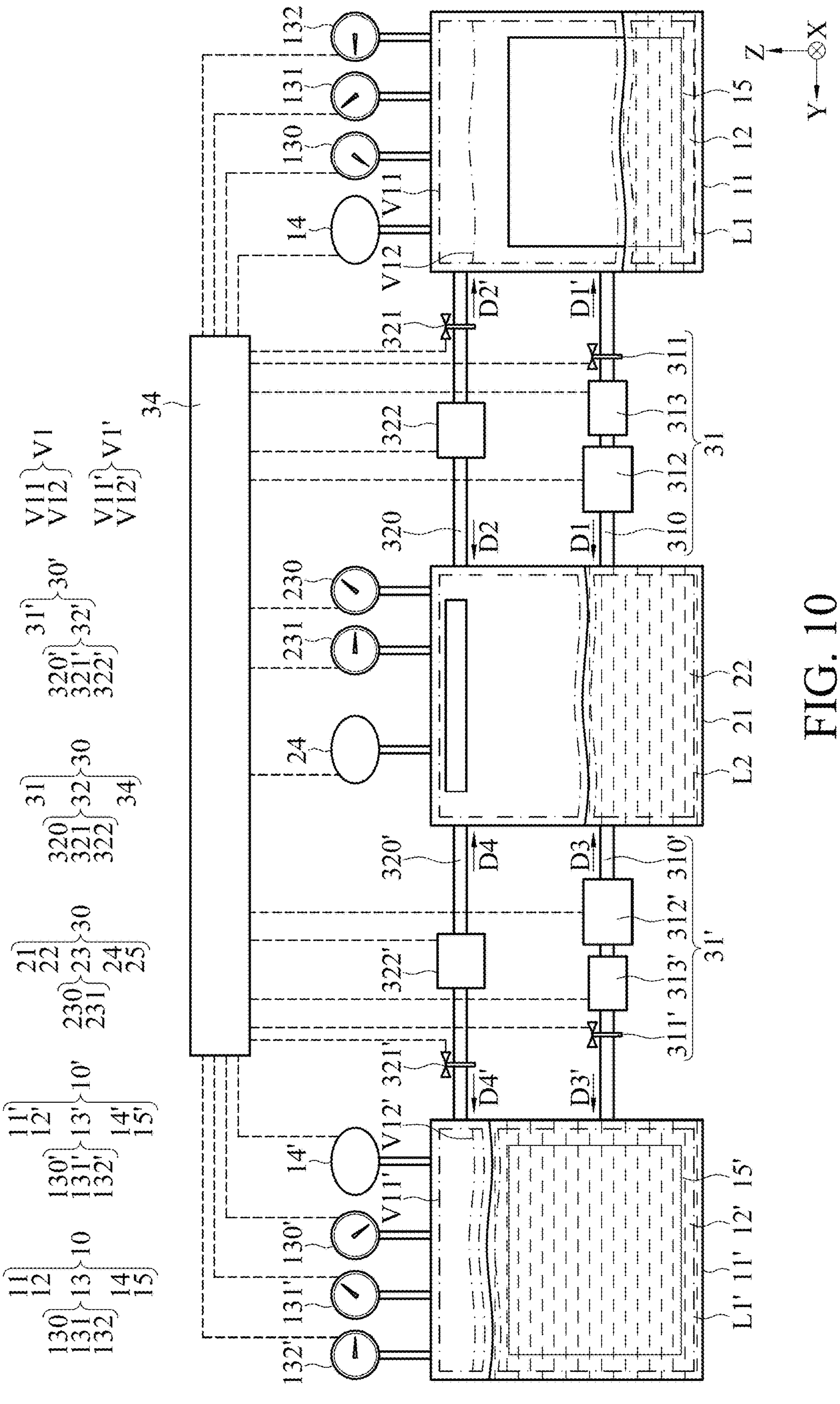
FIG. 10 illustrates a schematic structural view of an immersion cooling system according to some embodiments.

For another example, please refer to FIG. 10. FIG. 10 illustrates a schematic structural view of an immersion cooling system 1 according to some embodiments. In FIG. 10, the immersion cooling system 1 may comprise a plurality of work tanks 10, 10'. Through the first pipeline 310 (or 310'), the fluid 12 (or 12') of at least one of the work-tank liquid-phase regions L1, L1' may be transported to the buffer-tank liquid-phase region L2, or selectively, the fluid 22 of the buffer-tank liquid-phase region L2 may be transported to at least one of the work-tank liquid-phase regions L1, L1'. The buffer-tank gas-phase region V2 is selectively, through the corresponding one of the second pipelines 320, 320', in communication or not in communication with the corresponding one of the work-tank gas-phase regions V1, V1'. Embodiments of the work tank 10' (which may comprise a work-tank body 11', a fluid 12', a work-tank sensing assembly 13', a work-tank pressure control assembly 14', and a component(s) to be cooled 15', wherein the work-tank sensing assembly 13' may comprise a work-tank temperature sensor 130', a work-tank pressure sensor 131', and a work-tank liquid-level sensor 132', and the work-tank sensing assembly 13' may have a work-tank gas-phase region V1' (which may comprise an air sub-region V11' and a vapor sub-region V12') and a work-tank liquid-phase region L1'), and the communication control assembly 30' (which may comprise a first control assembly 31' and a second control assembly 32', wherein the first control assembly 31' may comprise a first pipeline 310', a first valve 311', a first pump 312', and a first filtration element 313'; and the second control assembly 32' may comprise a second pipeline 320', a second valve 321', and a dehumidification portion 322') can be referred to the aforementioned embodiments, which are not further described in detail herein. Moreover, it is noted that, according to some embodiments, the immersion cooling system 1 also comprises the aforementioned component(s) but simply not shown in FIG. 9 and not particularly limited to the embodiments shown in FIG. 9. Moreover, it is noted that, according to some embodiments, the immersion cooling system 1 also comprises the aforementioned component(s) either shown in FIG. 10 or not and not particularly limited to the embodiments shown in FIG. 10.

In some embodiments, the first pipelines 310, 310' are in communication with an adapter pipeline to be selectively in communication with the buffer tank 20 through the adapter pipeline. For example, the adapting pipeline is a T-joint having three connection ports, where one of the three connection ports is in communication with the first pipeline 310, another of the three connection ports is in communication with the first pipeline 310', and the other of the three connection ports is in communication with the buffer-tank liquid-phase region L2 of the buffer tank 20. Hence, according to some embodiments, the fluids 12, 12', the fluid 22 or both in the first pipelines 310, 310' can be collected before being transported through the adapter pipeline, which can not only simplify the cooling procedure but also make the flow rate of the fluids 12, 12' and/or the fluid 22 more stable.

Furthermore, in some embodiments, the control unit 34 is communicationally connected to a plurality of the work tanks 10, 10' to actuate the first control assemblies 31, 31', the second control assemblies 32, 32' or both depending upon the real-time status (e.g., the pressure and/or the liquid level) of each of the work tanks 10, 10' to selectively have at least one of the work tanks 10, 10' to be in communication with the buffer tank 20. For example, in FIG. 10, the control unit 34 would selectively have the work-tank liquid-phase region L1' of the work tank having a relatively higher liquid level among the work tanks 10, 10' (e.g., the work tank 10' shown in FIG. 10) to be in communication with the buffer-tank liquid-phase region L2 of the buffer tank 20, so that the fluid 12' (and/or the fluid 22) would be transported inside the first pipeline 310' along the third direction D3 (and/or the third direction D3). At the same time, the control unit 34 would selectively have the work-tank gas-phase region V1' of the work tank with the pressure being less than the pressure of the buffer tank 20 (e.g., the work tank 10' shown in FIG. 10) to be in communication with the buffer-tank gas-phase region V2 of the buffer tank 20, so that the gas-phase mixing fluid would be transported inside the second pipeline 320' along the fourth directions D4, D4'. Hence, at least one of the work tanks 10, 10' that is needed to be cooled or launch a maintenance mode may be instantly connected to the buffer tank 20 under different reference standards (e.g., the real-time state of each of the work tanks 10, 10'). Therefore, according to some embodiments, it can be ensured that the fluids 12, 12' in the work tanks 10, 10' are consistently kept at a low temperature, and thus not only proper cooling performance of the work tanks 10, 10' can be provided, but also the cooling time required for the work tank 10 to cool down can be reduced (as compared with the required time to wait for the work tank known to the inventors).

To sum up, according to some embodiments, one of two ends of each of the pipelines is in communication with the work tank(s), while the other one of the two ends of the pipelines is in communication with the buffer tank(s), where some of the pipelines can be applied with the liquid-phase working fluid of the work tank(s) and/or the buffer tank(s), while another some of the pipelines can be applied with the gas-phase mixing fluid of the work tank(s) and/or the buffer tank(s). Hence, the fluid of the work tank(s) can be selectively transported to the buffer tank(s), so that a cooling performance apparently better than that of the system known to the inventors can be achieved in a shorter time. Moreover, according to some embodiments, the liquid-phase working fluid with a lower temperature in the buffer tank(s) can be transported to the work tank(s), so that a cooling performance greatly better than that of the system known to the inventors can be achieved more rapidly and efficiently. Therefore, according to some embodiments, at least the following effects can be achieved: the overall cooling efficiency can be greatly enhanced, a large amount of the escaping gas-phase working fluid can be reduced, and the relatively longer time for cooling can be prevented, thereby reducing the cooling costs of the immersion cooling system.

Although the present disclosure is disclosed in the foregoing embodiments as above, it is not intended to limit the instant disclosure. Any person who is familiar with the relevant art can make some changes and modifications without departing from the spirit and scope of the present disclosure. Therefore, the scope of the present disclosure shall be subject to the definition of the scope of patent application attached to the specification.

What is claimed is:

1. An immersion cooling system comprising:

a work tank having a work-tank gas-phase region and a work-tank liquid-phase region;

a buffer tank having a buffer-tank gas-phase region and a buffer-tank liquid-phase region;

and a communication control assembly comprising:

a first pipeline;

a first pump, wherein in response to that actuation of the first pump is actuated, through the first pipeline, a fluid of the work-tank liquid-phase region is transported to the buffer-tank liquid-phase region or a fluid of the buffer-tank liquid-phase region is transported to the work-tank liquid-phase region;

a second pipeline;

a second valve, wherein in response to that actuation of the second valve is actuated, through the second pipeline, the work-tank gas-phase region is selectively in communication with the buffer-tank gas-phase region;

a third pipeline; and a third pump, wherein in response to actuation of the third pump, through the third pipeline, the fluid of the work-tank liquid-phase region is transported to the buffer-tank liquid-phase region or the fluid of the buffer-tank liquid-phase region is transported to the work-tank liquid-phase region.

2. The immersion cooling system according to claim 1, wherein:

the work tank further comprises a work-tank sensing assembly configured to sense a temperature of the work-tank liquid-phase region and a pressure of the work-tank gas-phase region; and the communication control assembly further comprises a control unit configured to, in response to the temperature of the work-tank liquid-phase region being greater than a preset temperature under a maintenance mode, actuate the first pump to transport the fluid of the work-tank liquid-phase region to the buffer-tank liquid-phase region, and in response to the pressure of the work-tank gas-phase region not being within a preset pressure range, actuate the second valve to have the work-tank gas-phase region to be in communication with the buffer-tank gas-phase region.

3. The immersion cooling system according to claim 2, wherein:

the work-tank sensing assembly is further configured to sense a liquid level of the work-tank liquid-phase region; and the control unit is further configured to actuate the first pump in response to the liquid level of the work-tank liquid-phase region being lower than a first preset level under the maintenance mode.

4. The immersion cooling system according to claim 3, wherein:

the control unit is further configured to actuate the second valve to have the work tank not to be in communication with the buffer tank in response to the liquid level of the work-tank liquid-phase region being lower than the first preset level under the maintenance mode.

5. The immersion cooling system according to claim 3, wherein the control unit is configured to, under a refilling mode, actuate the first pump to transport the fluid of the buffer-tank liquid-phase region to the work-tank liquid-phase region until the liquid level of the work-tank liquid-phase region is higher than a second preset level.

6. The immersion cooling system according to claim 3, wherein the work tank has a first connection port having the work tank to be in communication with the first pipeline, and a location level of the first connection port is lower than the first preset level.

7. The immersion cooling system according to claim 1, wherein the work-tank gas-phase region comprises an air sub-region and a vapor sub-region, the air sub-region is above the vapor sub-region, and the second pipeline is configured to selectively have the air sub-region to be in communication with or not in communication with the buffer-tank gas-phase region.

8. The immersion cooling system according to claim 1, wherein:

the work-tank gas-phase region comprises an air sub-region and a vapor sub-region, wherein the air sub-region is above the vapor sub-region; and the work tank has:

a first connection port configured to have the work-tank liquid-phase region to be in communication with the first pipeline; and a second connection port configured to have the air sub-region to be in communication with the second pipeline, wherein a location level of the second connection port is higher than a location level of the first connection port.

9. The immersion cooling system according to claim 2, wherein the work tank further comprises a work-tank pressure control assembly, and the control unit is configured to control the work-tank pressure control assembly to adjust the pressure of the work-tank gas-phase region.

10. The immersion cooling system according to claim 2, wherein the buffer tank further comprises a buffer-tank pressure control assembly, and the control unit is configured to control the buffer-tank pressure control assembly to adjust a pressure of the buffer-tank gas-phase region.

11. The immersion cooling system according to claim 2, wherein the immersion cooling system comprises a plurality of the work tanks; the control unit is configured to, in response to the temperature of at least one of the work-tank liquid-phase regions being greater than the preset temperature under the maintenance mode, actuate a corresponding one of the first pumps to transport the fluid of a corresponding one of the work-tank liquid-phase regions to the buffer-tank liquid-phase region, and the control unit is configured to, in response to the pressure of at least one of the work-tank gas-phase regions not being within a preset pressure range, actuate a corresponding one of the second valves to have a corresponding one of the work-tank gas-phase regions to be in communication with the buffer-tank gas-phase region.

12. The immersion cooling system according to claim 2, wherein the immersion cooling system comprises a plurality of the buffer tanks; the control unit is configured to, in response to the temperature of the work-tank liquid-phase region being greater than the preset temperature under the maintenance mode, actuate one of the first pumps corresponding to at least one of the buffer tanks to transport the fluid of the work-tank liquid-phase region to a corresponding one of the buffer-tank liquid-phase regions, and the control unit is configured to, in response to the pressure of at least one of the work-tank gas-phase regions not being within a preset pressure range, actuate one of the second valves corresponding to at least one of the buffer tanks to have the work-tank gas-phase region to be in communication with a corresponding one of the buffer-tank gas-phase regions.

13. The immersion cooling system according to claim 1, wherein:

the work tank further comprises a work-tank sensing assembly configured to sense a temperature of the work-tank liquid-phase region and a pressure of the work-tank gas-phase region; and the communication control assembly further comprises a control unit configured to, in response to the temperature of the work-tank liquid-phase region being greater than a preset temperature under a maintenance mode, actuate the first pump to transport the fluid of the buffer-tank liquid-phase region to the work-tank liquid-phase region, and actuate the third pump to transport the fluid of the work-tank liquid-phase region to the buffer-tank liquid-phase region.

14. The immersion cooling system according to claim 13, wherein:

the work-tank sensing assembly is further configured to sense a liquid level of the work-tank liquid-phase region; and the control unit is further configured to, in response to the liquid level of the work-tank liquid-phase region being lower than a first preset level under the maintenance mode, actuate the first pump.

15. The immersion cooling system according to claim 14, wherein:

the control unit is further configured to, in response to the liquid level of the work-tank liquid-phase region being lower than the first preset level under the maintenance mode, actuate the second valve to have the work tank not to be in communication with the buffer tank.

16. The immersion cooling system according to claim 14, wherein the control unit is configured to, under a refilling mode, actuate the first pump to transport the fluid of the buffer-tank liquid-phase region to the work-tank liquid-phase region, and actuate the third pump to transport the fluid of the work-tank liquid-phase region to the buffer-tank liquid-phase region until the liquid level of the work-tank liquid-phase region is higher than a second preset level.

17. The immersion cooling system according to claim 1, wherein:

the work tank further comprises a work-tank sensing assembly configured to sense a liquid level of the work-tank liquid-phase region; and the control unit is further configured to, in response to that the liquid level of the work-tank liquid-phase region being lower than a first preset level under a maintenance mode, actuate the first pump.

18. The immersion cooling system according to claim 17, wherein:

the control unit is further configured to, in response to the liquid level of the work-tank liquid-phase region being lower than the first preset level under the maintenance mode, actuate the second valve to have the work tank not to be in communication with the buffer tank.

19. The immersion cooling system according to claim 17, wherein the control unit is configured to, under a refilling mode, actuate the second valve to have the work tank not to be in communication with the buffer tank, actuate the first pump to transport the fluid of the buffer-tank liquid-phase region to the work-tank liquid-phase region, and actuate the third pump to transport the fluid of the work-tank liquid-phase region to the buffer-tank liquid-phase region until the liquid level of the work-tank liquid-phase region is higher than a second preset level.

20. The immersion cooling system according to claim 19, wherein the work-tank gas-phase region comprises an air sub-region and a vapor sub-region, the air sub-region is above the vapor sub-region, and the work tank has a second connection port configured to have the air sub-region to be in communication with the second pipeline.

21. The immersion cooling system according to claim 20, wherein the work tank has:

a first connection port configured to have the work tank to be in communication with the first pipeline; and a third connection port configured to have the work tank to be in communication with the third pipeline, wherein a location level of the second connection port is higher than a location level of the third connection port, the location level of the third connection port is higher than a location level of the first connection port, and the location level of the first connection port is lower than the first preset level.

22. The immersion cooling system according to claim 1, wherein the communication control assembly further comprises a third filtration element at the third pipeline.

23. The immersion cooling system according to claim 1, wherein the communication control assembly further comprises a first filtration element at the first pipeline.

24. The immersion cooling system according to claim 1, wherein the communication control assembly further comprises a dehumidification portion at the second pipeline.

25. The immersion cooling system according to claim 1, wherein the buffer tank further comprises a dehumidification assembly in the buffer-tank gas-phase region.

* * * * *